United States Patent
Tiwari

(10) Patent No.: US 10,409,555 B2
(45) Date of Patent: *Sep. 10, 2019

(54) MULTIPLICATION OPERATIONS IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/905,083

(22) Filed: Feb. 26, 2018

(65) Prior Publication Data

US 2018/0189031 A1 Jul. 5, 2018

Related U.S. Application Data

(63) Continuation of application No. 14/834,065, filed on Aug. 24, 2015, now Pat. No. 9,904,515.

(Continued)

(51) Int. Cl.
*G06F 7/523* (2006.01)
*G06G 7/16* (2006.01)
(Continued)

(52) U.S. Cl.
CPC ........... *G06F 7/523* (2013.01); *G06F 7/53* (2013.01); *G06G 7/16* (2013.01); *G11C 7/1006* (2013.01);
(Continued)

(58) Field of Classification Search
None
See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — David H Malzahn
(74) *Attorney, Agent, or Firm* — Brooks, Cameron & Huebsch, PLLC

(57) ABSTRACT

Examples of the present disclosure provide apparatuses and methods for performing multi-variable bit-length multiplication operations in a memory. An example method comprises performing a multiplication operation on a first vector and a second vector. The first vector includes a number of first elements stored in a group of memory cells coupled to a first access line and a number of sense lines of a memory array. The second vector includes a number of second elements stored in a group of memory cells coupled to a second access line and the number of sense lines of the memory array. The example multiplication operation can include performing a number of AND operations, OR operations and SHIFT operations without transferring data via an input/output (I/O) line.

20 Claims, 16 Drawing Sheets

Related U.S. Application Data

(60) Provisional application No. 62/045,119, filed on Sep. 3, 2014.

(51) Int. Cl.

| | | |
|---|---|---|
| *G06F 7/53* | (2006.01) | |
| *H03K 19/177* | (2006.01) | |
| *G11C 7/10* | (2006.01) | |
| *G11C 11/4091* | (2006.01) | |

(52) U.S. Cl.
CPC .... *H03K 19/17732* (2013.01); *G11C 11/4091* (2013.01)

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,430,687 A | 7/1995 | Hung et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,953,738 A | 9/1999 | Rao | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth et al. | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,058,880 B1 | 6/2006 | Ding et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,532,529 B2 | 5/2009 | Dadashev et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shirnano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |

(56) References Cited

U.S. PATENT DOCUMENTS

| | | |
|---|---|---|
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 9,898,252 B2 * | 2/2018 | Tiwari .................... G06F 7/523 |
| 9,904,515 B2 * | 2/2018 | Tiwari .................... G06F 7/523 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0089166 A1 | 3/2015 | Kogge |
| 2015/0134713 A1 | 5/2015 | Wheeler |
| 2015/0324290 A1 | 11/2015 | Leidel |
| 2015/0325272 A1 | 11/2015 | Murphy |
| 2016/0062733 A1 * | 3/2016 | Tiwari .................... G06F 7/523 708/190 |
| 2016/0063284 A1 * | 3/2016 | Tiwari .................... G06F 7/523 708/620 |
| 2016/0179570 A1 | 6/2016 | Peng |
| 2018/0173499 A1 * | 6/2018 | Tiwari .................... G06F 7/523 |
| 2018/0189031 A1 * | 7/2018 | Tiwari .................... G06F 7/523 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |

(56) References Cited

FOREIGN PATENT DOCUMENTS

| WO | 2013062596 | 5/2013 |
|---|---|---|
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled "Memory as a Programmable Logic Device," filed Feb. 22, 2013, (30 pgs.).

U.S. Appl. No. 13/774,553, entitled "Neural Network in a Memory Device," filed Feb. 22, 2013, (63 pgs).

U.S. Appl. No. 13/796,189, entitled, "Performing Complex Arithmetic Functions in a Memory Device," filed Mar. 12, 2013, (23 pgs.).

Office Action for related Taiwan Patent Application No. 104129201, dated Mar. 22, 2017, 13 pages.

Warren Jr., Henry S., "Hacker's Delight", Second Edition, Oct. 2013, pp. 181-184 and 194.

* cited by examiner

| | 431 COMP COMP | 433 DYNAMIC MASK | 435 STATIC MASK | 437 CARRY | 439 INTER-MEDIATE | 441 ITERATOR | 443 SRCA | 445 SRCB | 447 VECTOR MASK | 449 DEST |
|---|---|---|---|---|---|---|---|---|---|---|
| 451-1 | | | | | | | 0X3204080C | 0X33050203 | 0X88808080 | 0X00000000 |
| 451-2 | 0X80000000 | 0X00000000 | 0X00000000 | 0X00000000 | 0X00000000 | 0X00000000 | 0X3204080C | 0X33050203 | 0X88808080 | 0X00000000 |
| 451-3 | 0X00000001 | 0X80000000 | 0X00000000 | 0X00000000 | 0X00000000 | 0X00000000 | 0X3204080C | 0X33050203 | 0X88808080 | 0X00000000 |
| 451-4 | 0X11010101 | 0X00000001 | 0X00000000 | 0X00000000 | 0X00000000 | 0X00000000 | 0X3204080C | 0X33050203 | 0X88808080 | 0X00000000 |
| 451-5 | 0X777F7F7F | 0X11010101 | 0X00000000 | 0X00000000 | 0X00000000 | 0X00000000 | 0X3204080C | 0X33050203 | 0X88808080 | 0X00000000 |
| 451-6 | | 0X11010101 | 0X777F7F7F | 0X00000000 | 0X00000000 | 0X00000000 | 0X3204080C | 0X33050203 | 0X88808080 | 0X00000000 |

*Fig. 4A*

| | 431 COMP | 433 DYNAMIC MASK | 435 STATIC MASK | 437 CARRY | 439 INTER-MEDIATE | 441 ITERATOR | 443 SRCA | 445 SRCB | 447 VECTOR MASK | 449 DEST |
|---|---|---|---|---|---|---|---|---|---|---|
| 451-7.a | 0X33050203 | 0X11010101 | 0X777F7F7F | 0X00000000 | 0X00000000 | 0X00000000 | 0X3204080C | 0X33050203 | 0X88808080 | 0X00000000 |
| 451-7.b | 0X11010001 | 0X11010101 | 0X777F7F7F | 0X00000000 | 0X00000000 | 0X11010001 | 0X3204080C | 0X33050203 | 0X88808080 | 0X00000000 |
| 451-7.c | 0X11010001 | 0X11010101 | 0X777F7F7F | 0X00000000 | 0X11010001 | 0X00000000 | 0X3204080C | 0X33050203 | 0X88808080 | 0X00000000 |
| 451-7.d | 0X00000000 | 0X11010101 | 0X777F7F7F | 0X00000000 | 0XFFFFF00FF | 0X00000000 | 0X3204080C | 0X33050203 | 0X88808080 | 0X00000000 |
| 451-7.e | 0X3204080C | 0X11010101 | 0X777F7F7F | 0X00000000 | 0XFFFFF00FF | 0X00000000 | 0X3204080C | 0X33050203 | 0X88808080 | 0X00000000 |
| 451-7.f | 0X3204080C | 0X11010101 | 0X777F7F7F | 0X3204080C | 0XFFFFF00FF | 0X00000000 | 0X3204080C | 0X33050203 | 0X88808080 | 0X00000000 |
| 451-7.g | 0X11010101 | 0X11010101 | 0X777F7F7F | 0X3204080C | 0XFFFFF00FF | 0X00000000 | 0X3204080C | 0X33050203 | 0X88808080 | 0X00000000 |
| 451-7.h | 0X08808080 | 0X11010101 | 0X777F7F7F | 0X3204080C | 0XFFFFF00FF | 0X00000000 | 0X3204080C | 0X33050203 | 0X88808080 | 0X00000000 |
| 451-7.i | 0X00000000 | 0X11010101 | 0X777F7F7F | 0X3204080C | 0XFFFFF00FF | 0X00000000 | 0X3204080C | 0X33050203 | 0X88808080 | 0X00000000 |
| 451-7.j | 0X00000000 | 0X11010101 | 0X777F7F7F | 0X3204080C | 0XFFFFF00FF | 0X00000000 | 0X3204080C | 0X33050203 | 0X88808080 | 0X00000000 |
| 451-7.k | 0X00000000 | 0X11010101 | 0X777F7F7F | 0X3204080C | 0XFFFFF00FF | 0X00000000 | 0X3204080C | 0X33050203 | 0X88808080 | 0X00000000 |
| 451-7.l | 0X3204080C | 0X11010101 | 0X777F7F7F | 0X3204080C | 0XFFFFF00FF | 0X00000000 | 0X3204080C | 0X33050203 | 0X88808080 | 0X00000000 |
| 451-7.m | 0X3204000C | 0X11010101 | 0X777F7F7F | 0X3204080C | 0X3204000C | 0X00000000 | 0X3204080C | 0X33050203 | 0X88808080 | 0X00000000 |
| 451-7.n | 0X3204000C | 0X11010101 | 0X777F7F7F | 0X3204080C | 0X3204000C | 0X00000000 | 0X3204080C | 0X33050203 | 0X88808080 | 0X00000000 |
| 451-7.o | 0X3204000C | 0X11010101 | 0X777F7F7F | 0X3204080C | 0X3204000C | 0X00000000 | 0X3204080C | 0X33050203 | 0X88808080 | 0X00000000 |
| 451-7.p | 0X3204000C | 0X11010101 | 0X777F7F7F | 0X00000000 | 0X3204000C | 0X00000000 | 0X3204080C | 0X33050203 | 0X88808080 | 0X3204000C |
| 451-7.q | 0X00000000 | 0X11010101 | 0X777F7F7F | 0X00000000 | 0X3204000C | 0X00000000 | 0X3204080C | 0X33050203 | 0X88808080 | 0X3204000C |
| 451-7.r | 0X00000000 | 0X11010101 | 0X777F7F7F | 0X00000000 | 0X3204000C | 0X00000000 | 0X3204080C | 0X33050203 | 0X88808080 | 0X3204000C |
| 451-7.s | 0X00000000 | 0X11010101 | 0X777F7F7F | 0X00000000 | 0X3204000C | 0X00000000 | 0X3204080C | 0X33050203 | 0X88808080 | 0X3204000C |
| 451-7.t | 0X00000000 | 0X11010101 | 0X777F7F7F | 0X00000000 | 0X3204000C | 0X00000000 | 0X3204080C | 0X33050203 | 0X88808080 | 0X3204000C |
| 451-7.u | 0X11010101 | 0X11010101 | 0X777F7F7F | 0X00000000 | 0X3204000C | 0X00000000 | 0X3204080C | 0X33050203 | 0X88808080 | 0X3204000C |
| 451-7.v | 0X22020202 | 0X11010101 | 0X777F7F7F | 0X00000000 | 0X3204000C | 0X00000000 | 0X3204080C | 0X33050203 | 0X88808080 | 0X3204000C |
| 451-7.w | 0X22020202 | 0X11010101 | 0X777F7F7F | 0X00000000 | 0X3204000C | 0X00000000 | 0X3204080C | 0X33050203 | 0X88808080 | 0X3204000C |
| 451-7.x | 0X22020202 | 0X02020202 | 0X777F7F7F | 0X00000000 | 0X3204000C | 0X00000000 | 0X3204080C | 0X33050203 | 0X88808080 | 0X3204000C |

*Fig. 4B*

| | 431 | 433 | 435 | 437 | 439 | 441 | 443 | 445 | 447 | 449 |
|---|---|---|---|---|---|---|---|---|---|---|
| | COMP COMP | DYNAMIC MASK | STATIC MASK | CARRY | INTER-MEDIATE | ITERATOR | SRCA | SRCB | VECTOR MASK | DEST |
| 453-7.a | 0X33050203 | 0X22020202 | 0X777F7F7F | 0X00000000 | 0X3204000C | 0X00000000 | 0X3204080C | 0X33050203 | 0X88808080 | 0X3204000C |
| 453-7.b | 0X22000202 | 0X22020202 | 0X777F7F7F | 0X00000000 | 0X3204000C | 0X00000000 | 0X3204080C | 0X33050203 | 0X88808080 | 0X3204000C |
| 453-7.c | 0X22000202 | 0X22020202 | 0X777F7F7F | 0X00000000 | 0X22000202 | 0X22000202 | 0X3204080C | 0X33050203 | 0X88808080 | 0X3204000C |
| 453-7.d | 0X00000000 | 0X22020202 | 0X777F7F7F | 0X00000000 | 0XFE00FEFE | 0X00000000 | 0X3204080C | 0X33050203 | 0X88808080 | 0X3204000C |
| 453-7.e | 0X3204080C | 0X22020202 | 0X777F7F7F | 0X00000000 | 0XFE00FEFE | 0X00000000 | 0X3204080C | 0X33050203 | 0X88808080 | 0X3204000C |
| 453-7.f | 0X3204080C | 0X22020202 | 0X777F7F7F | 0X3204080C | 0XFE00FEFE | 0X00000000 | 0X3204080C | 0X33050203 | 0X88808080 | 0X3204000C |
| 453-7.g | 0X22000202 | 0X22020202 | 0X777F7F7F | 0X3204080C | 0XFE00FEFE | 0X00000000 | 0X3204080C | 0X33050203 | 0X88808080 | 0X3204000C |
| 453-7.h | 0X11010101 | 0X22020202 | 0X777F7F7F | 0X3204080C | 0XFE00FEFE | 0X00000000 | 0X3204080C | 0X33050203 | 0X88808080 | 0X3204000C |
| 453-7.i | 0X11010101 | 0X22020202 | 0X777F7F7F | 0X3204080C | 0XFE00FEFE | 0X00000000 | 0X3204080C | 0X33050203 | 0X88808080 | 0X3204000C |
| 453-7.j | 0X11010101 | 0X22020202 | 0X777F7F7F | 0X3204080C | 0XFE00FEFE | 0X11010101 | 0X3204080C | 0X33050203 | 0X88808080 | 0X3204000C |
| 453-7.k | 0X11010101 | 0X22020202 | 0X777F7F7F | 0X64081018 | 0XFE00FEFE | 0X00000000 | 0X3204080C | 0X33050203 | 0X88808080 | 0X3204000C |
| 453-7.l | 0X64081018 | 0X22020202 | 0X777F7F7F | 0X64081018 | 0XFE00FEFE | 0X00000000 | 0X3204080C | 0X33050203 | 0X88808080 | 0X3204000C |
| 453-7.m | 0X64081018 | 0X22020202 | 0X777F7F7F | 0X64081018 | 0X64001018 | 0X00000000 | 0X3204080C | 0X33050203 | 0X88808080 | 0X3204000C |
| 453-7.n | 0X64081018 | 0X22020202 | 0X777F7F7F | 0X64081018 | 0X64001018 | 0X00000000 | 0X3204080C | 0X33050203 | 0X88808080 | 0X3204000C |
| 453-7.o | 0X64081018 | 0X22020202 | 0X777F7F7F | 0X64001018 | 0X64001018 | 0X00000000 | 0X3204080C | 0X33050203 | 0X88808080 | 0X3204000C |
| 453-7.p | 0X56041014 | 0X22020202 | 0X777F7F7F | 0X64001018 | 0X64001018 | 0X00000000 | 0X3204080C | 0X33050203 | 0X88808080 | 0X56041014 |
| 453-7.q | 0X20000008 | 0X22020202 | 0X777F7F7F | 0X20000008 | 0X64001018 | 0X00000000 | 0X3204080C | 0X33050203 | 0X88808080 | 0X56041014 |
| 453-7.r | 0X20000008 | 0X22020202 | 0X777F7F7F | 0X20000008 | 0X64001018 | 0X00000000 | 0X3204080C | 0X33050203 | 0X88808080 | 0X56041014 |
| 453-7.s | 0X40000010 | 0X22020202 | 0X777F7F7F | 0X20000008 | 0X64001018 | 0X00000000 | 0X3204080C | 0X33050203 | 0X88808080 | 0X56041014 |
| 453-7.t | 0X00000000 | 0X22020202 | 0X777F7F7F | 0X00000000 | 0X64001018 | 0X00000000 | 0X3204080C | 0X33050203 | 0X88808080 | 0X96041024 |
| 453-7.u | 0X22020202 | 0X22020202 | 0X777F7F7F | 0X00000000 | 0X64001018 | 0X00000000 | 0X3204080C | 0X33050203 | 0X88808080 | 0X96041024 |
| 453-7.v | 0X44040404 | 0X22020202 | 0X777F7F7F | 0X00000000 | 0X64001018 | 0X00000000 | 0X3204080C | 0X33050203 | 0X88808080 | 0X96041024 |
| 453-7.w | 0X44040404 | 0X22020202 | 0X777F7F7F | 0X00000000 | 0X64001018 | 0X00000000 | 0X3204080C | 0X33050203 | 0X88808080 | 0X96041024 |
| 453-7.x | 0X44040404 | 0X44040404 | 0X777F7F7F | 0X00000000 | 0X64001018 | 0X00000000 | 0X3204080C | 0X33050203 | 0X88808080 | 0X96041024 |

Fig. 4C

| | 431 COMP COMP | 433 DYNAMIC MASK | 435 STATIC MASK | 437 CARRY | 439 INTER-MEDIATE | 441 ITERATOR | 443 SRCA | 445 SRCB | 447 VECTOR MASK | 449 DEST |
|---|---|---|---|---|---|---|---|---|---|---|
| 455-7.a | 0X33050203 | 0X44040404 | 0X777F7F7F | 0X00000000 | 0X64001018 | 0X00000000 | 0X3204080C | 0X33050203 | 0X88808080 | 0X96041024 |
| 455-7.b | 0X00040000 | 0X44040404 | 0X777F7F7F | 0X00000000 | 0X64001018 | 0X00000000 | 0X3204080C | 0X33050203 | 0X88808080 | 0X96041024 |
| 455-7.c | 0X00040000 | 0X44040404 | 0X777F7F7F | 0X00000000 | 0X00040000 | 0X00040000 | 0X3204080C | 0X33050203 | 0X88808080 | 0X96041024 |
| 455-7.d | 0X00040000 | 0X44040404 | 0X777F7F7F | 0X00000000 | 0X00FC0000 | 0X00000000 | 0X3204080C | 0X33050203 | 0X88808080 | 0X96041024 |
| 455-7.e | 0X3204080C | 0X44040404 | 0X777F7F7F | 0X00000000 | 0X00FC0000 | 0X00000000 | 0X3204080C | 0X33050203 | 0X88808080 | 0X96041024 |
| 455-7.f | 0X3204080C | 0X44040404 | 0X777F7F7F | 0X3204080C | 0X00FC0000 | 0X00000000 | 0X3204080C | 0X33050203 | 0X88808080 | 0X96041024 |
| 455-7.g | 0X44040404 | 0X44040404 | 0X777F7F7F | 0X3204080C | 0X00FC0000 | 0X00000000 | 0X3204080C | 0X33050203 | 0X88808080 | 0X96041024 |
| 455-7.h | 0X22020202 | 0X44040404 | 0X777F7F7F | 0X3204080C | 0X00FC0000 | 0X00000000 | 0X3204080C | 0X33050203 | 0X88808080 | 0X96041024 |
| 455-7.i | 0X22020202 | 0X44040404 | 0X777F7F7F | 0X3204080C | 0X00FC0000 | 0X00000000 | 0X3204080C | 0X33050203 | 0X88808080 | 0X96041024 |
| 455-7.j | 0X22020202 | 0X44040404 | 0X777F7F7F | 0X3204080C | 0X00FC0000 | 0X22020202 | 0X3204080C | 0X33050203 | 0X88808080 | 0X96041024 |
| 455-7.k | 0X00000000 | 0X44040404 | 0X777F7F7F | 0XC8102030 | 0X00FC0000 | 0X00000000 | 0X3204080C | 0X33050203 | 0X88808080 | 0X96041024 |
| 455-7.l | 0XC8102030 | 0X44040404 | 0X777F7F7F | 0XC8102030 | 0X00FC0000 | 0X00000000 | 0X3204080C | 0X33050203 | 0X88808080 | 0X96041024 |
| 455-7.m | 0X00100000 | 0X44040404 | 0X777F7F7F | 0XC8102030 | 0X00FC0000 | 0X00000000 | 0X3204080C | 0X33050203 | 0X88808080 | 0X96041024 |
| 455-7.n | 0X00100000 | 0X44040404 | 0X777F7F7F | 0X00100000 | 0X00100000 | 0X00000000 | 0X3204080C | 0X33050203 | 0X88808080 | 0X96041024 |
| 455-7.o | 0X00100000 | 0X44040404 | 0X777F7F7F | 0X00000000 | 0X00100000 | 0X00000000 | 0X3204080C | 0X33050203 | 0X88808080 | 0X96041024 |
| 455-7.p | 0X96141024 | 0X44040404 | 0X777F7F7F | 0X00000000 | 0X00100000 | 0X00000000 | 0X3204080C | 0X33050203 | 0X88808080 | 0X96141024 |
| 455-7.q | 0X00000000 | 0X44040404 | 0X777F7F7F | 0X00000000 | 0X00100000 | 0X00000000 | 0X3204080C | 0X33050203 | 0X88808080 | 0X96141024 |
| 455-7.r | 0X00000000 | 0X44040404 | 0X777F7F7F | 0X00000000 | 0X00100000 | 0X00000000 | 0X3204080C | 0X33050203 | 0X88808080 | 0X96141024 |
| 455-7.s | 0X00000000 | 0X44040404 | 0X777F7F7F | 0X00000000 | 0X00100000 | 0X00000000 | 0X3204080C | 0X33050203 | 0X88808080 | 0X96141024 |
| 455-7.t | 0X00000000 | 0X44040404 | 0X777F7F7F | 0X00000000 | 0X00100000 | 0X00000000 | 0X3204080C | 0X33050203 | 0X88808080 | 0X96141024 |
| 455-7.u | 0X44040404 | 0X44040404 | 0X777F7F7F | 0X00000000 | 0X00100000 | 0X00000000 | 0X3204080C | 0X33050203 | 0X88808080 | 0X96141024 |
| 455-7.v | 0X88080808 | 0X44040404 | 0X777F7F7F | 0X00000000 | 0X00100000 | 0X00000000 | 0X3204080C | 0X33050203 | 0X88808080 | 0X96141024 |
| 455-7.w | 0X88080808 | 0X44040404 | 0X777F7F7F | 0X00000000 | 0X00100000 | 0X00000000 | 0X3204080C | 0X33050203 | 0X88808080 | 0X96141024 |
| 455-7.x | 0X88080808 | 0X88080808 | 0X777F7F7F | 0X00000000 | 0X00100000 | 0X00000000 | 0X3204080C | 0X33050203 | 0X88808080 | 0X96141024 |

*Fig. 4D*

| | | 844 | 845 | 856 | 870 | 871 | | | | |
|---|---|---|---|---|---|---|---|---|---|---|
| | | A | B | NOT OPEN | OPEN TRUE | OPEN INVERT | | | | |
| | | 0 | 0 | 0 | 0 | 1 | | | | |
| | | 0 | 1 | 0 | 1 | 0 | | | | |
| | | 1 | 0 | 1 | 0 | 1 | | | | |
| | | 1 | 1 | 1 | 1 | 0 | | | | |

875 →

| | FF | 0 | 0 | 0 | 0 | 0 | 0 | 1 | 1 | 1 | ← 876 |
| | FT | 0 | 0 | 0 | 1 | 1 | 1 | 0 | 0 | 0 | ← 877 |
| | TF | 0 | 0 | 1 | 0 | 0 | 1 | 0 | 0 | 1 | ← 878 |
| | TT | 0 | 1 | 0 | 0 | 1 | 0 | 0 | 1 | 0 | ← 879 |
| A | B | A | A*B | A*B̄ | A+B | B | AXB | A+B̄ | $\overline{AXB}$ | B̄ | ← 847 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

MULTIPLICATION OPERATIONS IN MEMORY

PRIORITY INFORMATION

This application is a Continuation of U.S. application Ser. No. 14/834,065, filed Aug. 24, 2015, which issues as U.S. Pat. No. 9,904,515 on Feb. 27, 2018, which claims the benefit of U.S. Provisional Application No. 62/045,119, filed Sep. 3, 2014, the contents of which are incorporated herein by reference.

TECHNICAL FIELD

The present disclosure relates generally to semiconductor memory apparatuses and methods, and more particularly, to apparatuses and methods related to performing multiplication operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array to execute instructions). Data can be moved from the memory array to registers external to the memory array via a bus.

BRIEF DESCRIPTION OF THE DRAWINGS

FIG. 4A illustrates a table showing the states of memory cells of an array at a particular phase associated with performing a multiplication operation in accordance with a number of embodiments of the present disclosure.

FIG. 4B illustrates a table showing the states of memory cells of an array at a particular phase associated with performing a multiplication operation in accordance with a number of embodiments of the present disclosure.

FIG. 4C illustrates a table showing the states of memory cells of an array at a particular phase associated with performing a multiplication operation in accordance with a number of embodiments of the present disclosure.

FIG. 4D illustrates a table showing the states of memory cells of an array at a particular phase associated with performing a multiplication operation in accordance with a number of embodiments of the present disclosure.

DETAILED DESCRIPTION

Figure 1:
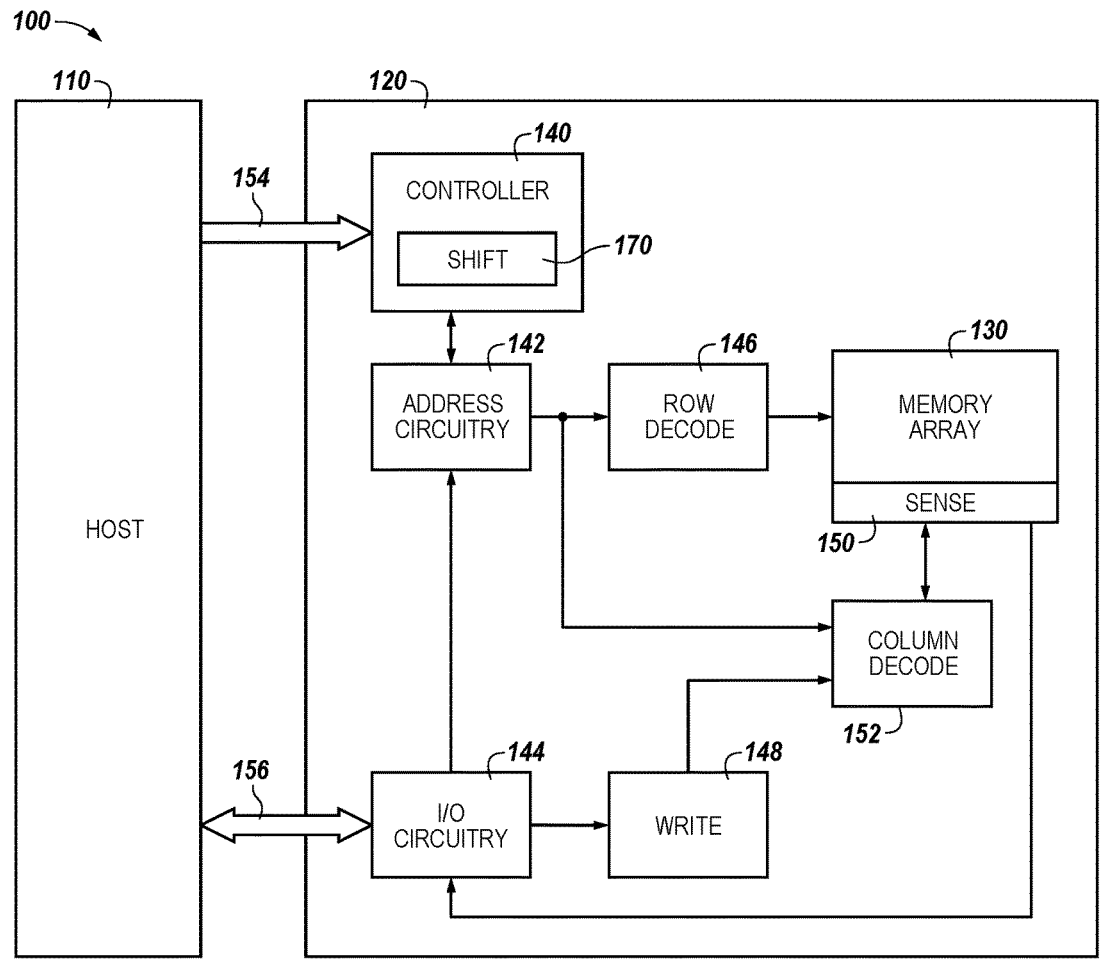
FIG. 1 is a block diagram of an apparatus in the form of a computing system including a memory device in accordance with a number of embodiments of the present disclosure.

The present disclosure includes apparatuses and methods related to multiplication operations for memory. A multiplication operation can be performed by multiplying bit-vectors comprising variable bit-lengths. For example, a multiplication operation can include multiplying a first vector with a number of first elements by a second vector with a number of second elements. The first vector can be stored in a group of memory cells coupled to a first access line and a number of sense lines of a memory array. The second vector can be stored in a group of memory cells coupled to a second access line and the number of sense lines of the memory array. The multiplication operation can include performing a number of AND operations, OR operations and SHIFT operations without transferring data via an input/output (I/O) line performed via a controller (e.g., a controller configured to control sensing circuitry).

As used herein, a first element and a second element can be numerical values that are multiplied by each other. Elements to be multiplied can be referred to as operands of a multiplication operation. The elements can, in a number of embodiments, be numerical values that can be stored in memory as bit-vectors. For example, a first element (e.g., a first operand) having a first value and stored as a first bit-vector can be multiplied by a second element (e.g., a second operand) having a second value and stored as a second bit-vector to obtain a multiplication result.

In a number of examples, an element can represent an object and/or other construct, which may be stored in memory as a bit-vector. As an example, a multiplication operation can be performed to multiply objects by multiplying the bit-vectors that represent the respective objects.

A number of embodiments of the present disclosure can provide a reduction of the number of computations and/or time involved in performing a number of multiplication operations (e.g., multiplication functions) relative to previous approaches. For instance, the number of computations and/or the time can be reduced due to an ability to perform various portions of the number of multiplication operations in parallel (e.g., simultaneously). Performing a number of multiplication operations as described herein can also reduce power consumption as compared to previous approaches. In accordance with a number of embodiments, a multiplication operation can be performed on elements (e.g., data in the form of bit-vectors stored in an array) without transferring data out of the memory array and/or sensing circuitry via a bus (e.g., data bus, address bus, control bus, etc.). A multiplication operation can involve performing a number of operations (e.g., AND operations, OR operations, and SHIFT operations, etc.). However, embodiments are not limited to these examples.

In various previous approaches, elements (e.g., a first value and a second value) to be multiplied may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single multiplication function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a multiplication operation, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 160 in accordance with a number of embodiments of the present disclosure. As used herein, a memory device 160, a memory array 130, and/or sensing circuitry 150 might also be separately considered an "apparatus."

System 100 includes a host 110 coupled to memory device 160, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 160 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIGS. 2 and 3.

The memory device 160 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIGS. 2A and 2B. For instance, in a number of embodiments, the sensing circuitry 150 can comprise a number of sense amplifiers and a number of compute components, which may comprise a latch serving as an accumulator and can be used to perform logical operations (e.g., on data associated with complementary sense lines). In a number of embodiments, the sensing circuitry (e.g., 150) can be used to perform multiplication operations using data stored in array 130 as inputs and store the results of the multiplication operations back to the array 130 without transferring via a sense line address access (e.g., without firing a column decode signal). As such, a multiplication function can be performed using sensing circuitry 150 rather than and/or in addition to being performed by processing resources external to the sensing circuitry 150 (e.g., by a processor associated with host 110 and/or other processing circuitry, such as ALU circuitry, located on device 160 (e.g., on control circuitry 140 or elsewhere)).

In various previous approaches, data associated with a multiplication operation, for instance, would be read from memory via sensing circuitry and provided to an external ALU. The external ALU circuitry would perform the multiplication functions using the elements (which may be referred to as operands or inputs) and the result could be transferred back to the array via the local I/O lines. In contrast, in a number of embodiments of the present disclosure, sensing circuitry (e.g., 150) is configured to perform a multiplication operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the multiplication function as the sensing circuitry 150 can be operated to perform the appropriate computations involved in performing the multiplication function using the address space of memory array 130. Additionally, the multiplication function can be performed without the use of an external processing resource.

Figure 2A:
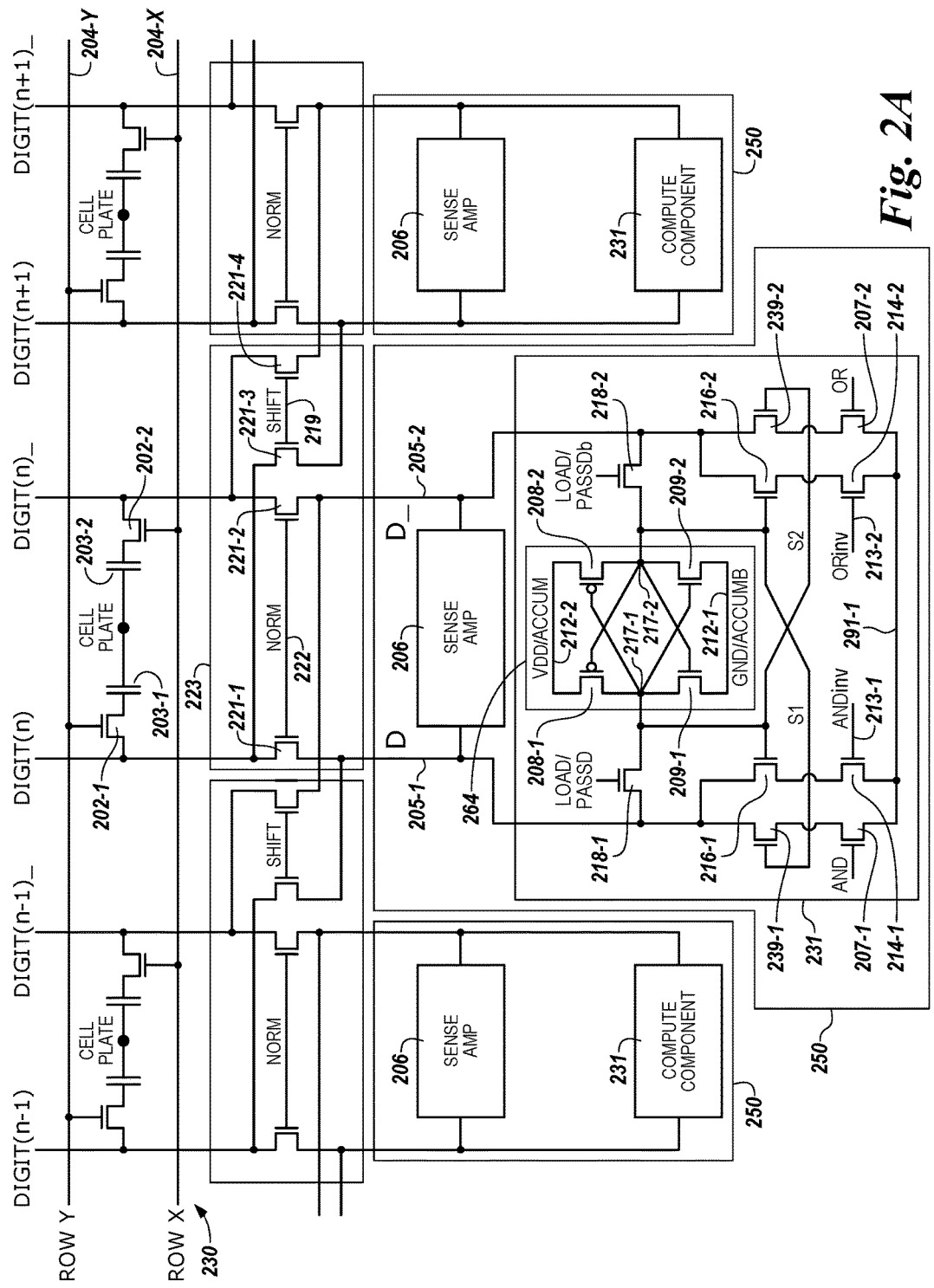
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell comprises a storage element (e.g., capacitor) and an access device (e.g., transistor). For instance, transistor 202-1 and capacitor 203-1 comprises a memory cell, and transistor 202-2 and capacitor 203-2 comprises a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can comprise a cross coupled latch, which can be referred to herein as a primary latch. The sense amplifier 206 can be configured, for example, as described with respect to FIG. 2B.

In the example illustrated in FIG. 2A, the circuitry corresponding to compute component 231 comprises a static latch 264 and an additional ten transistors that implement, among other things, a dynamic latch. The dynamic latch and/or static latch of the compute component 231 can be collectively referred to herein as a secondary latch, which can serve as an accumulator. As such, the compute component 231 can operate as and/or be referred to herein as an accumulator. The compute component 231 can be coupled to each of the data lines D 205-1 and D 205-2 as shown in FIG. 2A. However, embodiments are not limited to this example. The transistors of compute component 231 can all be n-channel transistors (e.g., NMOS transistors), for example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage 291-1 (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231 shown in FIG. 2A has the benefit of balancing the sense amplifier for functionality when the pull-down transistors 207-1, 207-2, 214-1, and 214-2 are conducting before the sense amplifier 206 is fired (e.g., during pre-seeding of the sense amplifier 206). As used herein, firing the sense amplifier 206 refers to enabling the sense amplifier 206 to set the primary latch and subsequently disabling the sense amplifier 206 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 2A is not contingent on the LOAD control signal being elevated to a voltage greater than $V_{DD}$.

According to some embodiments, the gate of load/pass transistor 218-1 can be coupled to a PASSD control signal, and the gate of load/pass transistor 218-2 can be coupled to a PASSDb control signal. In the configuration where the gates of transistors 218-1 and 218-2 are respectively coupled to one of the PASSD and PASSDb control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 223, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 1364 includes four transistors 208-1, 208-2, 1309-1, and 209-2 coupled to a pair of complementary data lines D 205-1 and D_ 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
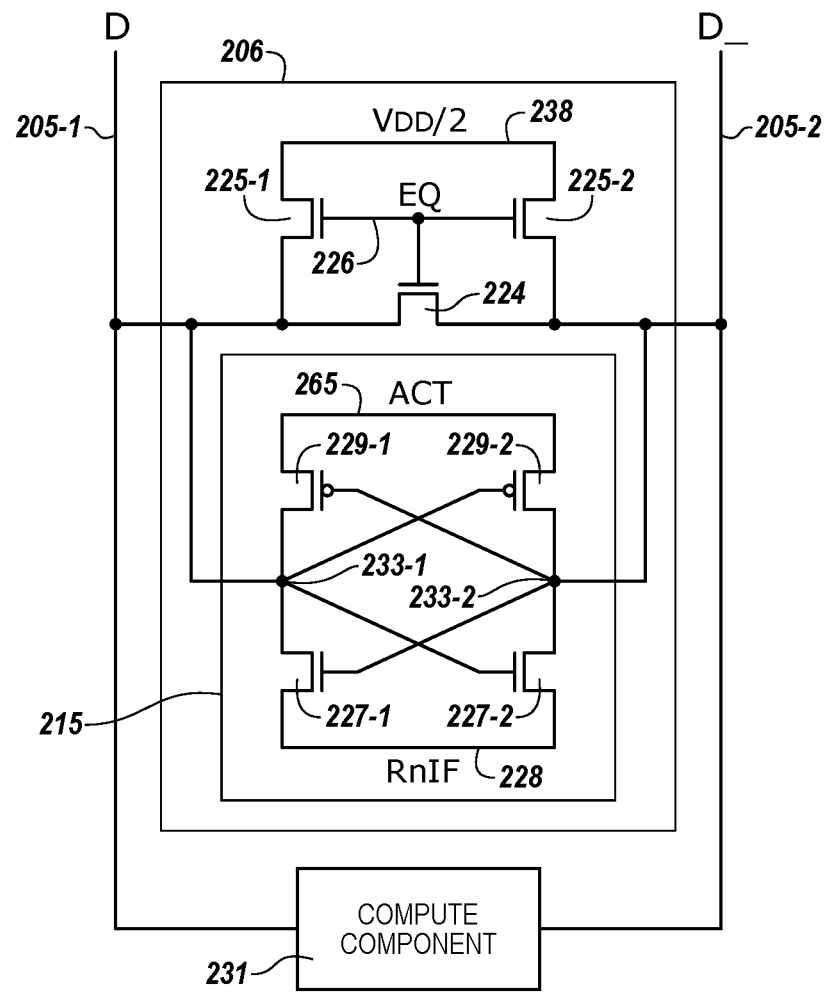
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 291-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206 and the compute component 231 can be coupled to the array 230 via shift circuitry 223. In this example, the shift circuitry 223 comprises a pair of isolation devices (e.g., isolation transistors 221-1 and 221-2) coupled to data lines 205-1 (D) and 205-2 (D_), respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231 to a corresponding column of memory cells (e.g., to a corresponding pair of complementary data lines 205-1 (D) and 205-2 (D_), and compute component 231-6 corresponding to DIGIT(n−1) and DIGIT(n−1)_ illustrated on the left complementary pair of sense lines and compute component 231-6 corresponding to DIGIT (n+1) and DIGIT(n+1)_ illustrated on the right complementary pair of sense lines). According to various embodiments, conduction of isolation transistors 221-1 and 221-2 can be referred to as a "normal" configuration of the shift circuitry 223.

In the example illustrated in FIG. 2A, the shift circuitry 223 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231 to another memory array (and isolate the particular sense amplifier 206 and compute component 231 from a first memory array). According to various embodiments, the shift circuitry 223 can be arranged as a portion of (e.g., within) the sense amplifier 206, for instance.

Although the shift circuitry 223 shown in FIG. 2A includes isolation transistors 221-1 and 221-2 used to couple particular sensing circuitry 250 (e.g., a particular sense amplifier 206 and corresponding compute component 231) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206 and compute components 231) in association with performing compute functions such as adding and subtracting functions without transferring data out of the sensing circuitry 250 via an I/O line (e.g., local I/O line (IO/IO_)), for instance.

Although not shown in FIG. 2A, each column of memory cells can be coupled to a column decode line that can be activated to transfer, via local I/O line, a data value from a corresponding sense amplifier 206 and/or compute component 231 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines D 205-1 and D_ 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and compute component 231, and the result can be stored in the sense amplifier and/or compute component.

The sensing circuitry 250 can be operated in several modes to perform logical operations, including a second mode in which a result of the logical operation is initially stored in the sense amplifier 206, and a first mode in which a result of the logical operation is initially stored in the compute component 231. Operation of the sensing circuitry 250 in the second mode is described below with respect to FIGS. 6A and 6B, and operation of the sensing circuitry 250 in the second mode is described below with respect to FIGS. 5A-5D. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

Figure 3:
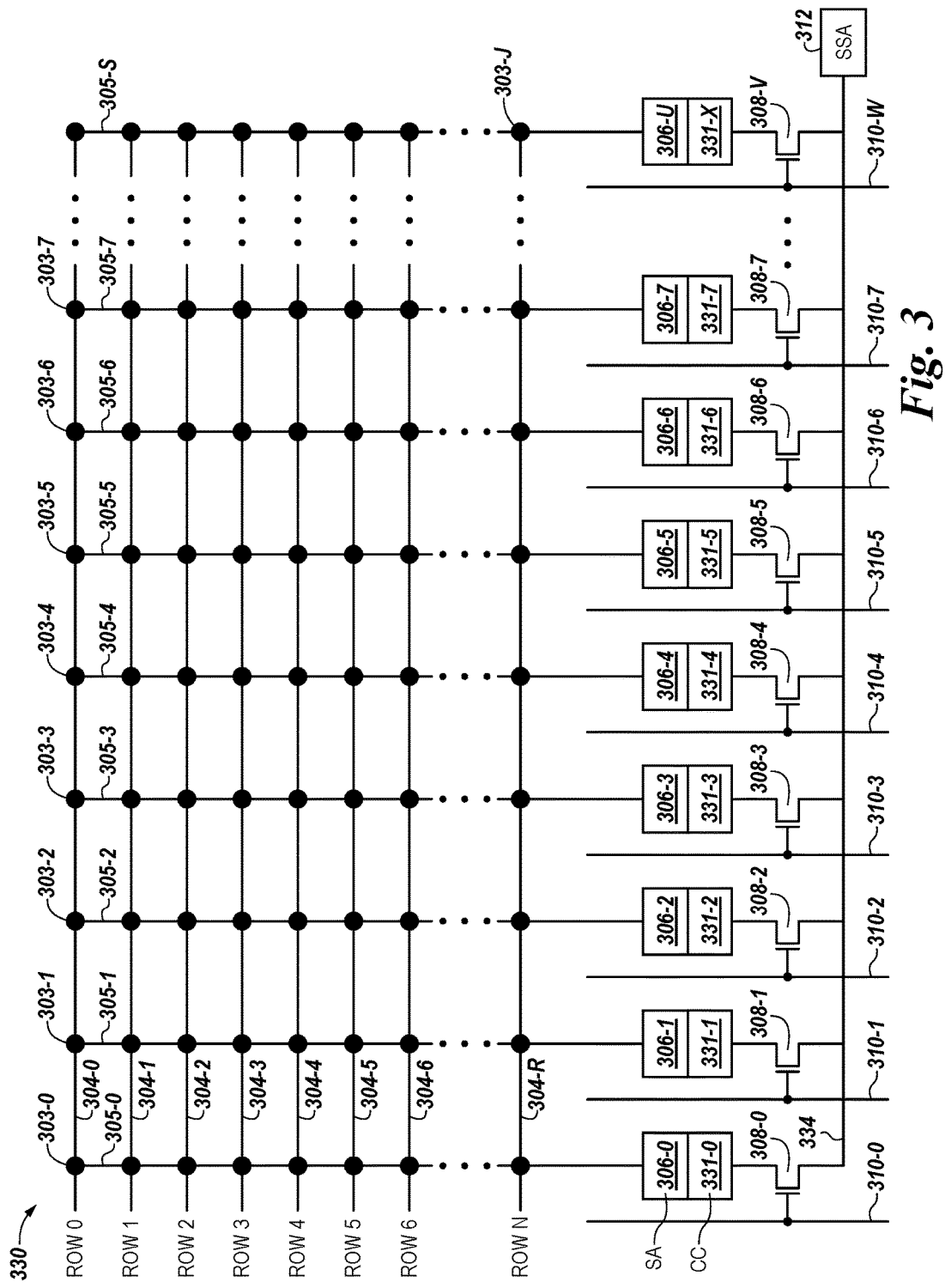
FIG. 3 illustrates a schematic diagram of a portion of a memory array in accordance with a number of embodiments of the present disclosure.

FIG. 3 illustrates a schematic diagram of a portion of a memory array 301 in accordance with a number of embodiments of the present disclosure. The array 301 includes memory cells (referred to generally as memory cells 303, and more specifically as 303-0 to 303-J) coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S. Memory array 301 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X coupled to the respective sense lines. Column decode lines 310-1 to 310-W are coupled to the gates of transistors 308-1 to 308-V, respectively, and can be selectively activated to transfer data sensed by respective sense amps 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

In a number of embodiments, the sensing circuitry (e.g., compute components 331 and sense amplifiers 306) is configured to perform a multiplication operation on elements stored in array 301. As an example, a first plurality of elements can be stored in a first group of memory cells coupled to a particular access line (e.g., 304-0) and to a number of sense lines (e.g., 305-0 to 305-S), and a second plurality of elements can be stored in a second group of memory cells coupled to a different access line (e.g., 304-1) and the respective number of sense lines (305-0 to 305-S). Each element of the first plurality of elements can be multiplied by a respective one of the second plurality of elements, and the result of the multiplication operation can be stored (e.g., as a bit-vector(s)) in a third group of memory cells coupled to a particular access line (e.g., 304-0 to 304-R) and to the number of sense lines (e.g., 305-0 to 305-S). The third group of memory cells can, for example, be coupled to an access line 304-R or to at least one of access lines 304-0 to 304-R. That is, the third group of memory cells can be a same group of memory cells as the first group of memory cells or the second group of memory cells (e.g., a result of a multiplication operation can be written over a currently stored element).

An example multiplication operation is described below in association with FIGS. 4A-4D, which illustrates tables showing the states of memory cells of an array (e.g., 301) at a number of particular phases associated with performing a multiplication operation in accordance with a number of embodiments described herein. The reference numbers of the rows of the tables shown in FIGS. 4A-4D correspond to respective reference numbers of the pseudo code described below (e.g., row 451-1 corresponds to reference number 1 of the pseudo code, rows 451-7a and 453-7a correspond to reference number 7a of the pseudo code, etc.). Each row of the tables indicates the values of a number of bit vectors 431 (Comp_Comp), 433 (Dynamic_Mask), 435 (Static_Mask), 437 (Carry), 439 (Intermediate), 441 (Iterator), 443 (srca), 445 (srcb), 447 (Vector Mask), and 449 (Dest) at a particular phase of the multiplication operation.

The example shown in FIGS. 4A-4D is associated with multiplying a first five elements stored in memory cells coupled to access line 304-0 and to sense lines 305-0 to 305-31 by a respective second five elements stored in memory cells coupled to access line 304-1 and to sense lines 305-0 to 305-31. In the example below, the first five elements are represented by a first bit-vector srca 443 (e.g., [0011 0001 00000101 00001000 00001100], which can be represented in hexadecimal notation as [3 2 04 08 0c] and is shown in FIGS. 4A-4D as "0x3204080c"). The second five elements are represented by a second bit-vector srcb 445 (e.g., [0011 0011 00000101 00000001 00000011], which can be represented in hexadecimal notation as [3 3 05 02 03] and is shown as "srcb" in FIGS. 4A-4D as "0x33050203"). The expected result of multiplying the first bit-vector srca 443 by the second bit-vector srcb 445 is bit-vector [0x96141024], which is shown in row 455-7x of the table shown in FIG. 4D (e.g., Dest 449).

In this example, the bit-vectors srca 443 and 445 have a length of 32 bits and the "ith" element of srca 443 is multiplied by the "ith" element of srcb 445 (e.g., the first element of srca 443 is multiplied by the first element of srcb 445, the second element of srca 443 is multiplied by the second element of srcb 445, etc.), such that five element pairs are multiplied. In this example, the five elements represented by each of srca 443 and srcb 445 have a variable length. For instance, the first and second elements of srca 443 and srcb 445 are represented by respective 4-bit vectors (e.g., the first and second elements comprise 4 bits) and the third, fourth, and fifth elements of srca 443 and srcb 445 are represented by respective 8-bit vectors (e.g., the third, fourth, and fifth elements comprise 8 bits). It is noted that although hexadecimal notation is used in FIGS. 4A-4D, the bit-vectors are stored as binary data patterns in the array during the multiplication operation. Also, in the examples described herein, commas and/or spaces may be used to separate individual elements within a bit-vector. For instance, in the example above, the bit-vectors 443 and 445 each comprise five elements which are separated by spaces. Embodiments are not limited to a particular element size (e.g., to a particular number of elements and/or bits per element). The result of the multiplication operation can be stored in array (e.g., 301) in which the vectors comprising the elements being multiplied are stored, and/or can be transferred external to the array (e.g., to functional unit circuitry of a host).

The expected result of multiplying the element pairs of srca 443 (e.g., [3 2 04 08 0c] in hexadecimal) and srcb 445 (e.g., [3 3 05 02 03] in hexadecimal) is [9 6 14 10 24]. As described further below, the result of a multiplication operation can be stored as a bit-vector in a particular group of memory cells. For instance, in the example of FIGS. 4A-4D, the memory cells corresponding to Dest 449 are used to store the result of the multiplication operation. As such, at the conclusion of the example described in FIGS. 4A-4D, the value of Dest 449 is [9 6 14 10 24] in hexadecimal (e.g., binary [1001 0110 00010100 00010000 00100100]), which represents the five resultant values corresponding to the five element pairs (e.g., 3×3=9, 2×3=6, 4×5=20, 8×2=16, and 12×3=36).

As described further below, the bit vectors 433 (Dynamic_Mask), 435 (Static_Mask), 437 (Carry), 439 (Intermediate), 441 (Iterator), 447 (Vector_Mask), and 449 (Dest) can be used in association with multiplying respective element pairs of the source bit-vectors 443 and 445 (e.g., the elements of the srca bit-vector 443 are multiplied by the respective elements of the srcb bit-vector 445). The bit-vectors 433, 435, 437, 439, 441, 447, and 449 can be stored in respective groups of memory cells coupled to particular access lines, which may be referred to as temporary storage rows (e.g., rows storing data that may be updated during various phases of a multiplication operation). As an example, the bit-vectors 433, 435, 437, 439, 441, 447, and 449 can have a same length as the srca and srcb bit-vectors 443 and 445, respectively, and can be stored in cells coupled to the same sense lines as the srca and srcb bit-vectors (e.g., sense lines 305-0 to 305-31). For instance, the bit-vector 433 can have a length of 32 bits and can be stored in a group of cells coupled to access line 304-2 and to sense lines 305-0 to 305-31, the bit-vector 435 can have a length of 32 bits and can be stored in a group of cells coupled to access line 304-3 and to sense lines 305-0 to 305-31, the bit-vector 437 can have a length of 32 bits and can be stored in a group of cells coupled to access line 304-4 and to sense lines 305-0 to 305-31, the bit-vector 439 can have a length of 32 bits and can be stored in a group of cells coupled to access line 304-5 and to sense lines 305-0 to 305-31, the bit-vector 441 can have a length of 32 bits and can be stored in a group of cells coupled to access line 304-6 and to sense lines 305-0 to 305-31, the bit-vector 447 can have a length of 32 bits and can be stored in a group of cells coupled to access line 304-7 (not shown) and to sense lines 305-0 to 305-31, and the bit-vector 449 can have a length of 32-bits and can be stored in a group of cells coupled to access line 304-8 (not shown) and to sense lines 305-0 to 305-31. The bit-vector 431 (Comp_Comp) represents the data stored in the sensing circuitry (e.g., compute components 331 and/or sense amplifiers 306) corresponding to the sense lines having cells coupled thereto which store elements being multiplied (e.g., sense lines 305-0 to 305-31 in this example).

In the example described in association with FIGS. 4A-4D, the first element of the srca bit-vector 443 (e.g., hexadecimal value "3") can be stored (e.g., as a four bit bit-vector [0011]) in memory cells 303-0 to 303-3, and the first element of the srcb bit-vector 445 (e.g., hexadecimal value "3") can be stored (e.g., as a four bit bit-vector [0011]) in memory cells coupled to access line 304-1 (e.g., ROW 1) and sense lines 305-0 to 305-3. As an example, the most significant bits (MSBs) of the respective bit-vectors (e.g., [0011] and [0011]) can be stored in cells coupled to sense line 305-0, the next MSBs of the respective bit-vectors can be stored in cells coupled to sense line 305-1, . . . , and the least significant bits (LSBs) of the respective bit-vectors can be stored in cells coupled to sense line 305-3. As used herein, the left most bit of a bit-vector is considered the MSB; however, embodiments are not so limited.

In a number of examples, a multiplication operation includes performing a number of AND operations, OR operations and SHIFT operations. The multiplication operation includes performing the AND operations, OR operations and SHIFT operations without transferring data via an input/output (I/O) line to multiply a first element by a second element. The number of AND operations, OR operations, and SHIFT operations can be performed using sensing circuitry on pitch with each of a number of columns of complementary sense lines.

The below pseudocode represents instructions executable to perform a number of multiplication operations in a memory in accordance with a number of embodiments of the present disclosure. The example pseudocode is referenced using reference numbers 1-7, which correspond to the reference numbers of the rows shown in the tables of FIGS. 4A-4D. For instance, reference number 1 (e.g., "Load srca, srcb, vector boundary mask into method") corresponds to row 451-1, reference number 2 (e.g., "Obtain all Temp Rows") corresponds to row 451-2, and reference number 7.a (e.g., "Load srcb in Comp_Comp") corresponds to rows 451-7.a, 453-7.a, and 455-7.a shown in FIGS. 4A-4D.

1. Load srca, srcb, and Vector_Mask
2. Obtain all Temp Rows
3. Determine MSB and store in Comp_Comp, Dynamic_Mask
4. Determine LSB by shifting right for total bit-length, store in Dynamic_Mask
5. Load Vector_Mask into Comp_Comp, Shift Left, Perform OR operation with Dynamic_Mask and overwrite Dynamic_Mask with Comp_Comp
6. Load inverse of Vector_Mask into Comp_Comp, store in Static_Mask
7 Loop until BlockOR terminates
   7.a Load srcb in Comp_Comp
   7.b Do Comp_Comp AND operation with Dynamic_Mask
   7.c Store Comp_Comp in Intermediate, Iterator
   7.d Secondary Loop until BlockOR terminates
      i. Load Intermediate in Comp_Comp
      ii. Shift Left
      iii. Perform OR operation with Intermediate
      iv. Store in Intermediate
      v. Load Iterator in Comp_Comp
      vi. Shift Left
      vii. Perform AND with Static_Mask
      viii. Store in Iterator
   7.e Load srca in Comp_Comp
   7.f Store in Carry
   7.g Load Dynamic_Mask in Comp_Comp
   7.h Shift Right
   7.i Perform AND with Static_Mask
   7.j Store in Iterator
   7.k Secondary Loop until BlockOR terminates
      i. Load Carry in Comp_Comp
      ii. Shift Left
      iii. Store in Carry
      iv. Load Iterator in Comp_Comp
      v. Shift Right
      vi. Perform AND with Static_Mask
      vii. Store in Iterator
   7.l Load Carry in Comp_Comp
   7.m Perform AND with Intermediate
   7.n Store in Intermediate
   7.o Store in Carry
   7.p Halfadd Intermediate and Dest, output Dest and Carry
   7.q Load Carry in Comp_Comp
   7.r Do Comp_Comp AND operation with Static_Mask
   7.s Shift Comp_Comp Left
   7.t For any true bits in Comp_Comp BlockOR
      i. Store Comp_Comp in Carry
      ii. Halfadd Dest and Carry, output Dest and Carry
      iii. Load Carry in Comp_Comp
      iv. Do Comp_Comp AND operation with Static_Mask
      v. Shift Comp_Comp Left
   7.u Load Dynamic_Mask in Comp_Comp
   7.v. Shift Left
   7.w Perform AND Static_Mask
   7.x Store Comp_Comp in Dynamic_Mask For purposes of discussion, the above pseudo code will be divided into a setup phase and a multiplication phase associated with performing a multiplication operation (e.g., multiplying the five elements of the srca bit-vector 443 by the corresponding five elements of the srcb bit-vector 445). The pseudo code referenced by reference numbers 1-6 can correspond to the setup phase. The setup phase can be performed simultaneously for a number of the multiplication operations. In the example illustrated in FIGS. 4A-4D, a bit-vector value illustrated in bold indicates a change in the value of the bit-vector (e.g., the value of the bit-vector stored in the memory cells corresponding to Dynamic_Mask 433 is shown in bold in FIG. 4A to indicate a change from [0x00000000] as shown in row 451-2 to [0x80000000] as shown in row 451-3). FIG. 4A illustrates the values of a number of bit-vectors associated with performing the setup phase of a multiplication operation. The pseudo code referenced by reference number 7 (e.g., 7.a-7.x) can correspond to the multiplication phase.

In a number of embodiments, the setup phase can be performed simultaneously for all of the elements that will be multiplied. The results (e.g., the resulting stored bit-vectors) corresponding to a number of operations performed in the setup phase are shown in FIG. 4A. Rows 451-1 to 451-6 of the table in FIG. 4A correspond to the above pseudocode instructions referenced by reference numbers 1 to 6, respectively. As such, rows 451-1 to 451-6 indicate values of the bit vectors 431, 433, 435, 437, 441, 443, 445, 447, and 449 during execution of the setup phase as described by the above pseudocode. Reference number 1 (e.g., "Load srca, srcb, and Vector_Mask") of the above pseudocode is associated with storing a first source bit-vector (e.g., srca bit-vector 443), a second source bit-vector (e.g., srcb bit-vector 445), and a mask bit-vector (e.g., Vector_Mask bit-vector 447) in an array (e.g., array 301). The source bit-vectors represent the elements (e.g., operands) to be multiplied. The Vector_Mask 447 indicates a most significant bit (MSB) for each element pair being multiplied. As an example, a bit pattern comprising a "1" in a MSB position and all "0s" in the remaining bit positions can be used to indicate the MSBs of the constituent elements of the source bit-vectors (e.g., srca 443 and srcb 445). As such, the bit pattern of Vector_Mask 447 identifies the length of the respective element pairs to be multiplied. As shown in row 451-1 of FIG. 4A, in this example, Vector_Mask 449 is a 32-bit hexadecimal bit-vector [88808080] (e.g., binary [1000 1000 10000000 10000000 10000000]), which indicates that the first two elements of srca 443 and srcb 445 have a length of four bits and the third, fourth, and fifth elements of srca 443 and srcb 445 have a length of eight bits.

Row 451-1 of the table shown in FIG. 4A illustrates the values of the srca and srcb bit-vectors 443 and 445 upon being stored (e.g., loaded) in an array (e.g., 301). As noted above, although the values of the bit-vectors are shown in FIGS. 4A to 4D in hexadecimal form for convenience, designated by the leading "0x" (e.g., the value of bit-vector 443 is shown as 0x3204080C), the bit-vectors can be stored as binary data patterns in the array. In addition, the bit-vector [0x0], as shown throughout FIGS. 4A-4D indicates a bit-vector of [0x00000000] and is shortened for ease of reference. As noted above, an example multiplication operation associated with execution of the above pseudocode includes multiplying the first element (e.g., binary [0011]/hexadecimal [0x3]) of the srca bit-vector 443 by the first element (e.g., binary [0011]/hexadecimal [0x3]) of the srcb bit-vector 445, the second element (e.g., binary [0010]/hexadecimal [0x2]) of the srca bit-vector 443 by the second element (e.g., binary [0011]/hexadecimal [0x3]) of the srcb bit-vector 445, the third element (e.g., binary [00000100]/hexadecimal [0x04]) of the srca bit-vector 443 by the third element (e.g., binary [00000101]/hexadecimal [0x05]) of the srcb bit-vector 445, the fourth element (e.g., binary [00001000]/hexadecimal [0x08]) of the srca bit-vector 443 by the fourth element (e.g., binary [00000010]/hexadecimal [0x02]) of the srcb bit-vector 445, and the fifth element (e.g., binary [00001100]/hexadecimal [0x0c] of the srca bit-vector 443 by the fifth element (e.g., binary [00000011]/hexadecimal [0x03]) of the srcb bit-vector 445. That is, the $i^{th}$ element of the srca bit-vector 443 is multiplied by the $i^{th}$ element of the srcb bit-vector 445. Row 451-1 shown in FIG. 4A also indicates that the memory cells used to store the results of the multiplication operation (e.g., Dest bit-vector 449) are "cleared" (e.g., a logic "0" is stored in each of the cells) during the setup phase. As shown in FIG. 4A, the bit-vector 449 has a value of 0x0. As noted above, Dest 449 can be stored in a group of memory cells coupled to access line 304-8 and to sense lines 305-0 to 305-31.

Reference number 2 (e.g., "Obtain all Temp Rows") of the above pseudocode is associated with initializing a number of groups of memory cells for use as temporary storage rows. Initializing refers to designating and/or assigning particular access lines used to store particular bit-vectors for performing the multiplication operation. That is, the number of groups of memory cells can be initialized and/or designated groups of cells coupled to respective access lines (e.g., rows) that store data (e.g., on a temporary basis) in association with performing the multiplication operation. For example, a first group of memory cells can be coupled to a particular access line (e.g., 304-2, illustrated as ROW 2) and can store a bit-vector referred to as a "Dynamic_Mask" bit-vector 433. A second group of memory cells can be coupled to another access line (e.g., 304-3, illustrated as ROW 3) and can store a bit-vector referred to as a "Static_Mask" bit-vector 435. A third group of memory cells can be coupled to another access line (e.g., 304-4, illustrated as ROW 4) and can store a bit-vector referred to as a "Carry" bit-vector 437. A fourth group of memory cells can be coupled to another access line (e.g., 304-5, illustrated as ROW 5) and can store a bit-vector referred to as a "Intermediate" bit-vector 439. A fifth group of memory cells can be coupled to another access line (e.g., 304-6, illustrated as ROW 6) and can store a bit-vector referred to as a "Iterator" bit-vector 441. A sixth group of memory cells can be coupled to another access line (e.g., 304-7, ROW 7, not shown in FIG. 3) and can store the "Vector_Mask" bit-vector 447. In a number of embodiments, the "Dest" bit-vector 449 can be stored in a group of memory cells coupled to another access line (e.g., 304-8, ROW 8, not shown), which can be considered a temporary storage row. Embodiments are not limited to a particular number of temporary storage rows and/or to storage of the corresponding bit-vectors on particular access lines. Also, although the groups of memory cells used to store bit-vectors 433, 435, 437, 439, 441, 447, and 449 may be referred to as "rows," the respective groups of memory cells may comprise fewer than all of the cells coupled to a particular access line. Furthermore, in a number of embodiments, temporary storage rows can refer to access lines which may not be addressable by a user (e.g., access lines that are outside of a user-addressable address space). In a number of examples, the bit-vectors stored in memory cells corresponding to the temporary storage rows are stored in memory cells coupled to the same sense lines as the element pairs that are being multiplied. That is, the LSBs of the source bit-vectors 443 and 445 can be stored in memory cells coupled to a same sense line as the sense line to which the memory cells storing the LSBs of the bit-vectors 433, 435, 437, 439, 441, 447, 449 are coupled, and the MSBs of the source bit-vectors 443 and 445 can be stored in memory cells coupled to a same sense line as the sense line to which the memory cells storing the MSBs of the bit-vectors 433, 435, 437, 439, 441, 447, 449 are coupled. For example, if each of the bit-vectors have a length of 32-bits, the LSBs of each of the bit-vectors 443, 445, 433, 435, 437, 439, 441, 447, and 449 can be stored in memory cells coupled to a same sense line (e.g., 305-31) and the MSBs of each of the bit-vectors 443, 445, 433, 435, 437, 439, 441, 447, and 449 can be stored in memory cells coupled to a same sense line (e.g., 305-0).

The Dynamic_Mask bit-vector 433 can be used, for instance, as a mask to indicate a particular bit position(s) within the source bit-vectors (e.g., 443 and 445) and/or within the element pairs being multiplied. The Dynamic_Mask 433 is considered a dynamic mask since its value can change (e.g., is dynamic) as the multiplication operation is performed. The Static_Mask 435 can also be used to provide a mask to perform the multiplication operation. The Static_Mask 435 is considered a static mask since its value does not change during the multiplication operation. As described further below, the bit pattern of Static_Mask 435 can be the inverse of the bit pattern of Vector_Mask 447 (e.g., such that bit pattern of Static_Mask 435 can comprise a "0" at each bit position corresponding to a MSB of one of the respective element pairs being multiplied and a "0" at the remaining bit positions). As described further below, Carry 437 can be used to store a carry value(s) in association with performing the multiplication operation. Intermediate 439 and Iterator 441 can be used to store temporary data values while performing the multiplication operation. Dest 447 can be used to store the result of the multiplication operation. Row 451-2 of FIG. 4A shows each of the initialized bit-vectors 433, 435, 437, 439, 441, and 449 having a value of 0x0 (e.g., hexadecimal bit-vector [00000000] or binary bit-vector [00000000000000000000000000000000]).

Reference number 3 (e.g., "Determine MSB and store in Comp_Comp, Dynamic_Mask") of the above pseudocode is associated with determining the MSB of the bit-vectors (e.g., srca 443 and srcb 445) comprising elements to be multiplied, and storing, as a bit-vector, a bit pattern indicating the MSB of the bit-vectors (e.g., 443 and/or 445) in particular locations within an array (e.g., 301). As an example, the bit pattern indicating the MSB of the bit-vectors 443 and/or 445 can be stored (e.g., as a bit-vector) in the group of memory cells used to store the Dynamic_Mask 433 and can be stored in the sensing circuitry (e.g., compute components 331-0 to 331-31 and/or sense amplifiers 306-0 to 306-31) as Comp_Comp bit-vector 431. In a number of embodiments, the bit pattern indicating the MSB of the srca and srcb bit-vectors comprises a "1" bit in the MSB position and a "0" bit in the remaining bit positions. For instance, as shown in row 451-3 of the table of FIG. 4A, the Comp_Comp bit-vector 431 and the Dynamic_Mask bit-vector 433 each comprise bit-vector [0x80000000] (in hexadecimal form), which corresponds to a 32-bit vector in which the MSB is a "1" and the remaining 31 bits are "0s". For example, the sensing circuitry coupled to sense line 305-0 (e.g., compute component 331-0 and/or sense amplifier 306-0) can latch a "1" and the sensing circuitry coupled to sense lines 305-1 to 305-31 (e.g., compute components 331-1 to 331-31 and/or sense amplifiers 306-1 to 306-31) can each latch a "0".

Reference number 4 of the above pseudocode (e.g., "Determine LSB by shifting right for total length, store in Dynamic Mask") is associated with determining an LSB of the bit-vectors (e.g., srca 443 and srcb 445) comprising elements to be multiplied, and storing a bit pattern indicating the LSB in a particular location within the array (e.g., in the group of memory cells used to store Dynamic_Mask 433). The bit pattern indicating the LSB of srca 443 and srcb 445 can be determined by performing a number of right shifts on the bit pattern used to indicate the MSB of the bit-vectors 443 and 445. The number of right shifts corresponds to one less than the total length of the srca bit-vector 443 and the srcb bit-vector 445 (e.g., 31 shifts since the total length is 32 bits in this example). As shown in row 451-3 of FIG. 4A, prior to executing the pseudocode corresponding to reference number 4, the bit pattern indicating the MSB (e.g., [0x80000000]) resides in the sensing circuitry corresponding to Comp_Comp 431. As such, the bit pattern corresponding to the LSB of bit-vectors 443 and 445 can be determined by performing 31 right shifts on Comp_Comp 431 such that each bit of Comp_Comp 431 is shifted 31 bit positions to the right (e.g., the value of the bit stored in the sensing circuitry coupled to sense line 305-0 is shifted to the sensing circuitry coupled to sense line 305-31). In this example, performing 31 right shifts on Comp_Comp 431 (e.g. [0x80000000]) results in the value of Comp_Comp 431 being [0x00000001] (e.g., as shown in row 451-4 of FIG. 4A. The value of Comp_Comp 431 can be copied to the cells corresponding to Dynamic_Mask 433. As such, as shown in row 451-4 of FIG. 4A, the Dynamic_Mask 433 also stores [0x00000001] (e.g., the bit pattern indicating the LSB of the bit-vectors 443 and 445).

Reference number 5 of the above pseudocode (e.g., "Load Vector Mask into Comp_Comp, Shift Left, Perform OR operation with Dynamic_Mask and overwrite Dynamic_Mask with Comp_Comp") is associated with storing, in the cells storing the Dynamic_Mask 433, a bit pattern indicating the LSBs of the respective element pairs being multiplied in advance of performing the multiplication phase (e.g., prior to executing the above pseudocode corresponding to reference number 7). In this example, "1s" in the bit pattern are used to indicate the bit positions (e.g., locations) of the LSBs of the respective elements. As such, as shown in row 451-5 of FIG. 4A, Dynamic_Mask 433 is [0x11010101] (e.g., binary [0001 0001 00000001 00000001 00000001]) indicating the LSBs of the respective element pairs of srca 443 and srcb 445, which comprise a first element pair having a length of four bits, a second element pair having a length of four bits, a third element pair having a length of eight bits, a fourth element pair having a length of eight bits, and a fifth element pair having a length of eight bits. The bit-vector (e.g., [0x11010101] indicating the LSBs of the respective element pairs can be obtained by loading the Vector Mask bit-vector 447 (e.g., bit-vector [0x88808080]) into the sensing circuitry corresponding to Comp_Comp 431. The Comp_Comp bit-vector 431, now storing [0x88808080], can be left-shifted one bit position such that Comp_Comp 431 stores [0x11010100]. The shifted bit-vector (e.g., bit-vector [0x11010100]) stored as Comp_Comp 431 is ORed with the Dynamic_Mask bit-vector 433 (e.g., bit-vector [0x00000001]), which currently indicates the LSB of the bit-vectors 443 and 445, and the result of the OR operation (e.g., bit-vector [0x11010101]) is stored as (e.g., overwrites) Dynamic_Mask 433.

As used herein, performing a logical operation on a first and second bit-vector can include performing, in parallel, the logical operation on each of the respective bits at corresponding bit positions of the bit-vectors. As an example, the result of a logical OR operation performed on a first bit-vector "a" (e.g., [$a_0$ $a_1$ $a_2$ $a_3$]) and a second bit-vector "b" (e.g., [$b_0$ $b_1$ $b_2$ $b_3$]) is a bit-vector "c" (e.g., [$c_0$ $c_1$ $c_2$ $c_3$]) whose MSB (e.g., $c_0$) is the result of "ORing" the MSB of bit-vector "a" and the MSB of bit-vector "b," whose next MSB is the result of ORing the next MSBs of bit-vectors "a" and "b," and whose LSB is the result of ORing the LSB of bit-vector "a" and the LSB of bit-vector "b" (e.g., $c_0$=$a_0$ OR $b_0$; $c_1$=$a_1$ OR $b_1$; $c_2$=$a_2$ OR $b_2$; $c_3$=$a_3$ OR $b_3$). For instance, performing an OR operation on a bit-vector [1110] and on bit-vector [1000] would result in bit-vector [1110] (e.g., the MSB of the resultant bit-vector is "1" since "1" OR "1" is "1", the next MSB is "1" since "1" OR "0" is "1", the next MSB is "1" since "1" OR "0" is "1", and the LSB is "0" since "0" OR "0" is "0").

Reference number 6 (e.g., "Store inverse of Vector_Mask in Static_Mask"), is associated with storing the inverse of the Vector Mask bit-vector 447 (e.g., [0x88808080]) in the cells corresponding to Static_Mask 435. For example, Vector Mask 447 can be loaded into the Comp_Comp 431 such that Comp_Comp 431 stores [0x88808080]. The Comp_Comp bit-vector can be inverted (e.g., via an invert operation such as described further below) such that Comp_Comp 431 stores [0x777f7f7f], which can be stored as (e.g., copied to) the memory cells corresponding to Static_Mask 435 (e.g., by activating the access line to which the memory cells corresponding to Static_Mask 435 are coupled). Therefore, as illustrated at row 451-6 in FIG. 4A, Static_Mask 435 stores bit-vector [0x777F7F7F] (e.g., binary [0111 0111 01111111 01111111 01111111]), which comprises a "0" at the MSB positions corresponding to each one of the respective element pairs being multiplied (e.g., the elements pairs of srca 443 and srcb 445) and a "1" at the remaining bit positions.

Therefore, at the conclusion of the setup phase corresponding to reference numbers 1-6 of the above pseudocode, and as shown in row 451-6 of FIG. 4A: the Dynamic_Mask 433 stores [0x11010101] (e.g., binary [0001 0001 00000001 00000001 00000001], which comprises a "1" at the LSB positions corresponding to the respective element pairs being multiplied and a "0" at the remaining bit positions; the Vector_Mask 447 stores [0x88808080] (e.g., binary [1000 1000 10000000 10000000 10000000]), which comprises a "1" at the MSB positions corresponding to the respective element pairs being multiplied and a "0" at the remaining bit positions; the Static_Mask 435 stores [0x777F7F7F] (e.g., binary [0111 0111 01111111 01111111 01111111]), which is the inverse of Vector_Mask 447 and comprises a "0" at the MSB positions corresponding to the respective elements pairs being multiplied and a "1" at the remaining bit positions; srca 443 stores [0x3204080C] (e.g., binary [0011 0010 00000100 00001000 00001100]), which represents a first element comprising a decimal value of "3," a second element comprising a decimal value of "2," a third element comprising a decimal value of "4," a fourth element comprising a decimal value of "8," and a fifth element comprising a decimal value of "12"; srcb 445 stores [0x33050203] (e.g., binary [0011 0011 00000101 00000010 00000011]), which represents a first element comprising a decimal value of "3," a second element comprising a decimal value of "2," a third element comprising a decimal value of "5," a fourth element comprising a decimal value of "2," and a fifth element comprising a decimal value of "3"; and the bit-vectors 437 (Carry), 439 (Intermediate), 441 (Iterator), and 449 (Dest) store [0x0] (e.g., a "0" in each of their bit positions, which is 32 in this example).

Reference number 7 of the above pseudocode (e.g., "Loop until BlockOR terminates") corresponds to the multiplication phase of a multiplication operation in accordance with a number of embodiments of the present disclosure. Reference number 7 corresponds to a loop (e.g., a "For loop," a "While loop," a "Do loop," etc.) that comprises execution of the pseudocode corresponding to reference numbers 7.a-7.x until a particular condition is met. In this example, the particular condition is a BlockOR operation terminating (e.g., by returning a "0," or false bit, which indicates that the current bit pattern of Comp_Comp 431 comprises all "0s," e.g., that none of the compute components and/or sense amplifiers corresponding to Comp_Comp 431 store a "1," or true bit). As such, the multiplication phase can comprise performing a number of iterations of the pseudocode corresponding to references 7.a-7.x, with a BlockOR operation being performed at the conclusion of each iteration. A BlockOR operation will be described further below. As used herein, the loop corresponding to reference number 7 can be referred to as a "primary loop." As described below, execution of the primary loop corresponding to reference number 7 can include execution of a number of secondary loops, which may also be performed until a particular condition is met (e.g., until a BlockOR operation terminates). For example, secondary loops will be described below in association with the pseudocode corresponding to reference numbers 7.d. (e.g., 7.d.i-7.d.viii) and 7.k (e.g., 7.k.i-7.k-vii).

The number of times the primary loop is performed can be based on the length of the element pairs being multiplied. For example, the number of times the primary loop is performed can be equal to the length of the longest of the element pairs. For instance, in this example in which the longest element pair comprises eight bits (e.g., the third, fourth, and fifth element pairs comprise eight bits), the primary loop can be performed eight times (e.g., the BlockOR operation corresponding to reference number 7 terminates after the eighth iteration of the primary loop). However, embodiments are not limited to this example. For instance, the primary loop can be terminated after fewer iterations depending on the particular bit patterns of the elements being multiplied (e.g., if the bit patterns being multiplied have a number of leading "0s," then those bit positions will not change the result of the product).

As such, each iteration of the primary loop can be executed in association with determining a contribution to the multiplication operation of a particular bit position of the element pairs being multiplied. For example, a first iteration of the primary loop can be executed to determine a contribution to the multiplication operation of a LSB position of the respective element pairs being multiplied (e.g., the LSB positions of the five element pairs of srca 443 and srcb 445), a second iteration of the primary loop can be executed to determine a contribution to the multiplication operation of the next LSB position of the respective element pairs being multiplied (e.g., the next LSB positions of the srca 443 and srcb 445 bit-vectors), etc. As an example, determining a contribution to the multiplication operation of a particular bit position in association with an iteration of the primary loop can involve performing a shift (e.g., left shift) on determined partial products of the respective element pairs and adding the shifted partial products to previously determined corresponding partial product sums. Upon completion of the final iteration of the primary loop (e.g., upon execution of the pseudocode corresponding to reference number 7.x for a final iteration), temporary rows can be released to complete the multiplication operation. In a number of examples, the results of the multiplication operation can be stored in the array 301. In a number of examples, the result of the multiplication operation can be sent and/or returned to a host, such as host 110 in FIG. 1. In a number of examples, each iteration of the primary loop can be performed sequentially. FIGS. 4B, 4C, and 4D each illustrate values of the bit-vectors (e.g., 431, 433, 435, 437, 439, 441, 443, 445, 447, and 449) at the various operation phases (e.g., during execution of the pseudocode corresponding to reference numbers 7.a-7.x) corresponding to the primary loop (e.g., FIG. 4B illustrates the bit-vector values in association with a first iteration of the primary loop, FIG. 4C illustrates the bit-vector values in association with a second iteration of the primary loop, and FIG. 4D illustrates the bit-vector values in association with a third iteration of the primary loop).

In a number of embodiments, a "BlockOR" operation can be performed in association with determining whether one or more (e.g., any) of the compute components (e.g., 331-0 to 331-X) and/or sense amplifiers (e.g., 306-0 to 306-U) coupled to a particular group of sense lines (e.g., 305-0 to 305-S) store a particular data value (e.g., a "1" or a "0"). For example, determining whether any of the compute components 331-0 to 331-31 coupled to sense lines 305-0 to 305-31 store a particular data value can include charging (e.g., precharging) a local I/O line such as local I/O line 334 shown in FIG. 3) to a particular voltage, and then sensing (e.g., via a secondary sense amplifier, such as SSA 312 shown in FIG. 3) whether the voltage on the local I/O line changes (e.g., by more than a threshold amount) responsive to transferring (e.g., in parallel) the voltages corresponding to the data latched in the selected compute components 331-0 to 331-31 to the local I/O line. The I/O line (e.g., I/O line 334) can be precharged via control circuitry such as control circuitry 140 shown in FIG. 1 and/or sensing circuitry such as circuitry 150 shown in FIG. 1, for instance, to a voltage such as a supply voltage (e.g., Vcc) or a ground voltage (e.g., 0V).

Transferring the voltages corresponding to the data latched in the selected compute components 331-0 to 331-31 can include activating (e.g., in parallel) the column decode lines (e.g., column decode lines 310-0 to 310-W in FIG. 3) corresponding to the selected sensing circuitry (e.g., compute components 331-0 to 331-31 in this example) such that respective transistors 308-0 to 308-31 are enabled (e.g., turned on)

As an example, to determine whether one or more of the selected compute components 331-0 to 331-31 stores (e.g., latches) a data value of "1" (e.g., a logic 1 which can be represented by a supply voltage Vcc), the I/O line (e.g., I/O line 334) can be precharged to a ground voltage (e.g., 0V, which can represent a latched data value of "0"). The corresponding column decode lines 310-0 to 310-31 can be activated, and if one or more of the selected compute components 331-0 to 331-31 stores a logic 1 (e.g., Vcc), then the SSA (e.g., SSA 312) can sense a pull up (e.g., increase) of the voltage on the I/O line (e.g., I/O line 334) which indicates that at least one of the selected compute components 331-0 to 331-31 stores a "1," which can be indicated by the BlockOR operation returning a "true" bit (e.g., "1"). In this example, if none of the compute components 331-0 to 331-31 stored a "1," then the voltage on the I/O line would not be pulled up, which can be indicated by the BlockOR operation returning a false bit (e.g., "0").

Alternatively, to determine whether one or more of the selected compute components 331-0 to 331-31 stores (e.g., latches) a data value of "0," the I/O line (e.g., I/O line 334) can be pre-charged to a supply voltage (e.g., Vcc). The corresponding column decode lines 310-0 to 310-31 can be activated, and if one or more of the selected compute components 331-0 to 331-31 stores a logic 0 (e.g., 0V), then the SSA (e.g., SSA 312) can sense a pull down (e.g., decrease) of the voltage on the I/O line (e.g., I/O line 334) which indicates that at least one of the selected compute components 331-0 to 331-31 stores a "0."

The determination of whether one or more compute components (e.g., 331-0 to 331-X) and/or sense amplifiers (e.g., 306-0 to 306-U) coupled to selected column decode lines (e.g., column decode lines 310-0 to 310-W) stores a particular data value (e.g., a data value of "1") is effectively performing a logic "OR" operation (e.g., since the operation returns a "1" if any of the data values are "1" and the operation returns a "0" only if all of the data values are "0"), which is why the operation may be referred to as a "BlockOR" operation. Embodiments of the present disclosure are not limited to particular pre-charge voltages of the local I/O line and/or to particular voltage values corresponding to logic "1" and logic "0".

FIG. 4B illustrates a table showing the states of memory cells of an array at a particular phase associated with performing a multiplication operation in accordance with a number of embodiments of the present disclosure. FIG. 4B illustrates the values of the number of bit-vectors 431, 433, 435, 437, 439, 441, 443, 445, 447, and 449 during a first iteration of the primary loop corresponding to the multiplication phase associated with the pseudocode referenced above by reference number 7 (e.g., a first iteration of 7.a-7.x).

Reference 7.a. (e.g., "Load srcb in Comp_Comp") of the above pseudocode is associated with loading the srcb bit-vector 445 (e.g., bit-vector [0x33050203], which can be stored in memory cells coupled to a particular access line and to sense lines 305-0 to 305-31) into the appropriate sensing circuitry corresponding to Comp_Comp 431 (e.g., compute components 331-0 to 331-31 and/or sense amplifiers 306-0 to 306-31, in this example). For instance, the 4 bits corresponding to the first element (e.g., [0x3] or binary [0011]) of srcb 445 can be loaded into compute components 331-0 to 331-3 (e.g., with the MSB being loaded into compute component 331-0 and each subsequent next-most-significant bit being loaded into the subsequent corresponding compute components 331-1 to 331-3 such that a "0" is stored in compute components 331-0 and 331-1 and a "1" is stored in compute components 331-2 and 331-3). Subsequent elements (e.g., the second ([0x3], third ([0x05]), fourth ([0x02]), and fifth ([0x03]) element) of the srcb bit-vector 445 can be loaded into subsequent corresponding compute components 331-4 to 331-31. As such, row 451-7.a of the table shown in FIG. 4B illustrates the bit vector 431 having a value of [0x33050203].

At reference 7.b (e.g., "Do Comp_Comp AND operation with Dynamic_Mask"), an AND logical operation can be performed on the Comp_Comp bit-vector 431 and the Dynamic_Mask bit-vector 433, which, for purposes of this example, can be stored in memory cells coupled to the access line 304-2 and to sense lines 331-0 to 331-31). The result of the AND operation can be retained in the sensing circuitry corresponding to Comp_Comp 431.

Since the value of the srcb bit-vector 445 was loaded into the compute components 331-0 to 331-31 (e.g., at reference 7.a), the result of "ANDing" Comp_Comp 431 with the Dynamic_Mask 433 is analogous to the result of ANDing srcb 445 with Dynamic_Mask 433. In this example, ANDing Comp_Comp 431 (e.g., [0011 0011 00000101 00000010 00000011], which is [0x33050203]) with Dynamic_Mask 433 (e.g., [0001 0001 00000001 00000001 00000001], which is [0x10101010]) results in bit-vector [0001 0001 00000001 00000000 00000001] (e.g., [0x11010001]), which is retained in the corresponding sensing circuitry as Comp_Comp 431. Therefore, row 451-7.b of FIG. 4B illustrates the Comp_Comp 431 as being [0x11010001]. The result of the AND operation can serve as an intermediate mask in subsequent operation phases. For example, the "1" bit can indicate an element that will contribute to a particular iteration of the multiplication operation. That is, since the first, second, third, and fifth elements include a "1" in the least significant bit position corresponding to each element of the intermediate mask, those elements will contribute to the first iteration of the multiplication operation (see description of reference 7.d associated with row 451-7.d in FIG. 4B for how the intermediate mask is further created). The contribution of the elements including a "1" in their LSBs can include carry values from performing the multiplication operation.

At reference 7.c (e.g., "Store Comp_Comp in Intermediate, Iterator"), the result of the AND operation performed at reference 7.b (e.g., bit-vector [0x11010001]) is stored in (e.g., written to) the memory cells storing the Intermediate 439 and in the memory cells storing the Iterator 441. As an example, Intermediate 439 can be stored in cells coupled to access line 304-5 and to sense lines 305-0 to 305-31 and Iterator 441 can be stored in cells coupled to access line 304-6 and to sense lines 305-0 to 305-31. As described further below, the value of Comp_Comp 431 can be copied to the memory cells corresponding to particular bit-vectors (e.g., Intermediate 439 and Iterator) by activating the access lines to which the cells storing the particular bit-vectors are coupled (e.g., access lines 304-5 and 304-6). As such, row 451-7.c of the table shown in FIG. 4B illustrates Intermediate 439 and Iterator 441 having a value of [0x11010001].

At reference 7.d (e.g., "Secondary LOOP until BlockOR terminates"), a secondary loop corresponding to reference numbers 7.d.i. to 7.d.viii. is repeated until a BlockOR operation returns an indication that Comp_Comp 431 comprises all "0s". The secondary loop (e.g., references 7.d.i. to 7.d.viii.) is performed to create a mask to be stored as Intermediate 439. At reference 7.d.i. (e.g., "Load Intermediate in Comp_Comp"), Intermediate 439 (e.g., [0x11010001]) is loaded into the Comp_Comp 431 (e.g., compute components 331-0 to 331-31). At reference 7.d.ii.

(e.g., Shift Left), each bit of the bit-vector stored in the Comp_Comp 431 (e.g., [0x11010001]) is shifted one compute component to the left, resulting in bit-vector [22020002] being stored in the Comp_Comp 431. That is, each bit of the first element (e.g., element [0001] or [0x1]) is shifted to the left, resulting in element [0010]. The second element [0001] is shifted to result in [0010], the third element [00000001] is shifted to result in [00000010], the fourth element [00000000] is shifted to result in [00000000], and the fifth element [00000001] is shifted to result in [00000010]. The fifth element's least significant bit (LSB) (e.g., "1") shifts to the left and the LSB position now stores a "0" since there is no bit in a compute component to the right, in this example, to indicate what to shift into that LSB position (e.g., no bit stored in a compute component to the right of the LSB of the fifth element, which would be compute component 331-32 if it was designated).

At reference 7.d.iii (e.g., "Perform OR operation with Intermediate"), an OR operation is performed with the bit-vector stored in the Comp_Comp 431 (e.g., [0x22020002]) and Intermediate (e.g, [0x11010001]), resulting in bit-vector [0x33030003]. At reference 7.d.iv. (e.g., "Store in Intermediate"), the resulting bit-vector (e.g., [0x33030003]) is stored as Intermediate 439. At reference 7.d.v. (e.g., "Load Iterator in Comp_Comp"), Iterator 441 (e.g., [0x11010001]) is loaded into the Comp_Comp 431. At reference 7.d.vi. (e.g., "Shift Left"), each bit of the bit-vector stored in the Comp_Comp 431 (e.g., [0x11010001]) is shifted one compute component to the left, resulting in bit-vector [0x22020002] being stored in the Comp_Comp 431. At reference 7.d.vii. (e.g., "Perform AND with Static_Mask"), the bit-vector stored in Comp_Comp 431 is ANDed with Static_Mask 435 (e.g., [0x777f7f7f]). At reference 7.d.viii (e.g., "Store in Iterator"), the result of the AND operation (e.g., [0x22020002 from ANDing [0x22020002] with [0x777f7f7f]) is stored as Iterator 441. Since, at the end of the AND operation, the bit-vector [0x22020002] is still in Comp_Comp 441, the BlockOR operation at reference 7 (e.g., "LOOP until BlockOR(s) terminates") is performed on the bit-vector [0x22020002] to determine if there is a "1" in the bit-vector. Since bit-vector [0x22020002] contains at least one "1", the LOOP repeats.

The second LOOP of references 7.d.i. to 7.d.viii. includes, at reference 7.d.i, loading Intermediate 439 (e.g., [0x33030003]) into the Comp_Comp 431 and, at reference 7.d.ii., performing a left shift. The left shift results in bit-vector [0x66060006]. The result of the left-shift (e.g., [0x66060006]) is ORed, at reference 7.d.iii., with Intermediate (e.g., [0x33030003]), resulting in bit-vector [0x77070007]. The resulting bit-vector (e.g., [0x77070007]) is stored, at reference 7.d.iv., as Intermediate 439. Iterator 441 (e.g., [0x22020002]) is loaded, at reference 7.d.v., into the Comp_Comp 431. Iterator 441 is shifted left, at reference 7.d.vi., resulting in bit-vector [0x44040004] in Comp_Comp 431. The resulting bit-vector [0x44040004] in Comp_Comp 431 is ANDed, at reference 7.d.vii., with Static_Mask 435 (e.g., [0x777f7f7f]). The result of the AND operation (e.g., [0x44040004]) is stored, at reference 7.d.viii., as Iterator 441. A BlockOR operation is performed at the end of the second loop and, since the [0x44040004] bit-vector is stored in the Comp_Comp 431 and includes a "1", the LOOP repeats.

The third LOOP of references 7.d.i to 7.d.viii., results in a left-shifted Intermediate bit-vector (e.g., [0xee0e000e]) being ORed with Intermediate (e.g., [0x77070007]). The result of the OR operation (e.g., [0xff0f000f]) is stored as Intermediate 439. Iterator 441 is left-shifted (resulting in [0x88080008]) and ANDed with Static_Mask 435 (e.g., [0x777f7f7f]), resulting in bit-vector [0x88080008] being stored as Iterator 441. A BlockOR performed on the bit-vector [0x88080008] stored in Comp_Comp 431 results in a repeat of the LOOP.

The third LOOP of references 7.d.i to 7.d.viii. results in a Intermediate bit-vector 439 of [0xff1f001f] and a Iterator bit-vector 441 of [0x00100010]. Since bit-vector [0x00100010] includes a "1", performing a BlockOR indicates repeating the LOOP. The fourth LOOP of references 7.d.i to 7.d.viii. results in a Intermediate bit-vector 439 of [0xff3f003f] and a Iterator bit-vector 441 of [0x00200020]. The BlockOR performed on [0x00200020] indicates to repeat the LOOP. The fifth LOOP of references 7.d.i to 7.d.viii. results in a Intermediate bit-vector 439 of [0xff7f007f] and a Iterator bit-vector 441 of [0x00400040]. The BlockOR performed on [0x00400040] indicates to repeat the LOOP. The sixth LOOP of references 7.d.i to 7.d.viii results in a Intermediate bit-vector 439 of [0xffff00ff] and a Iterator bit-vector 441 of [0x00000000] (e.g., ORing Iterator [0x00800080] with the Static_Mask [0x777f7f7f] results in [0x00000000]). The BlockOR performed on [0x00000000] indicates to terminate the LOOP and move to reference 7.e. As shown at row 451-*d* in FIG. 4B, the Comp_Comp 431 stores a [0x0] (indicating the last Iterator bit-vector 441 stored), Intermediate 439 is [0xffff00ff], and Iterator 441 is [0x00000000] (indicated by [0x0]).

At reference 7.e. (e.g., "Load srca in Comp_Comp"), the srca bit-vector 443 (e.g., [0x3204080c]) is loaded into corresponding compute components (e.g., stored as Comp_Comp 431. For example, the bits of the first element of the srca bit-vector (e.g., first element bit-vector [0011]) can be stored in corresponding compute components such that a first and second compute component (e.g., compute components 331-0 and 331-1) store a "0", and a third and fourth compute component (e.g., compute components 331-2 and 331-3) store a "1." In this example, additional compute components (e.g., compute components 331-4 to 331-31) store the second, third, fourth, and fifth elements of the srca bit-vector 443.

At reference 7.f (e.g., "Store in Carry"), the bit-vector stored in Comp_Comp 431 (e.g., srca bit-vector [0x3204080c]) is stored as Carry 437, as shown at row 451-*f*. At reference 7.g (e.g., "Load Dynamic_Mask in Comp_Comp"), the Dynamic_Mask bit-vector 433 (e.g., [0x11010101]), is loaded into the compute components (e.g., stored as Comp_Comp 431), as shown at row 451-*g* in FIG. 4B. At reference 7.h (e.g., "Shift Right"), each of the bits of the bit-vector stored in Comp_Comp 431 (e.g., [0x11010101]) are shifted one compute component to the right, resulting in bit-vector [0x08808080], as shown at row 451-*h*. At reference 7.i (e.g., "Perform AND with Static_Mask"), the bit-vector stored in the Comp_Comp 431 (e.g., [0x08808080]) is ANDed with Static_Mask 435 (e.g., [0x777f7f7f]). At reference 7.j (e.g., "Store in Iterator"), the result of the AND operation (e.g., bit-vector [0x00000000], indicated by [0x0]) is stored as Iterator 441, as shown at row 451-*j*.

At reference 7.k (e.g., "Secondary LOOP until Block-OR(s) terminates"), a secondary LOOP including references 7.k.i. to 7.k.vii. is repeated until there are no "1"s stored in the compute components (e.g., stored as Comp_Comp 431). At reference 7.k.i. (e.g., "Load Carry in Comp_Comp"), the secondary loop begins by loading Carry 437 (e.g., [0x3204080c]) into the compute components (e.g., stored as Comp_Comp 431). At reference 7.k.ii (e.g., "Shift Left"), a shift operation is performed that is based on an iteration of the multiplication operation. (e.g., references 7.a to 7.x). For example, during a first iteration of the multiplication operation (e.g., references 7.a to 7.x illustrated by FIG. 4B), the secondary loop (e.g., including references 7.k.i. to 7.k.vii) includes performing zero shifts of the bits of the bit-vector. During a second iteration of the multiplication operation (e.g., references 7.a to 7.x illustrated by FIG. 4C), the secondary loop includes performing one (1) shift to the left for each bit of the bit-vector. For a third iteration of the multiplication operation, each bit shifts two (2) compute components to the left. Since this is the first iteration of the multiplication operation, the bit-vector is shifted zero positions.

At reference 7.k.iii (e.g., "Store in Carry"), the bit-vector (e.g., [0x3204080c]) loaded in the compute components (e.g., stored as Comp_Comp 431), is stored as Carry 437, as shown at row 451-k. At reference 7.k.iv (e.g., "Load Iterator in Comp_Comp"), Iterator 441 (e.g., [0x0]) is loaded into the compute components (e.g., stored as Comp_Comp 431). At reference 7.k.v (e.g., "Shift Right"), each of the bits of the bit-vector (e.g., [0x0]) loaded in the Comp_Comp 431 is shifted to the right (e.g., each bit of [0x00000000] is shifted one position to the right, resulting in [0x00000000]). At reference 7.k.vi. (e.g., "Perform AND with Static_Mask"), the shifted bit-vector (e.g., [0x0]) is ANDed with Static_Mask 435 (e.g., [0x777f7f7f]), resulting in bit-vector [0x00000000] (indicated by [0x0]). At reference 7.k.vii (e.g., "Store in Iterator"), the result of the AND operation (e.g., [0x0]) is stored as Iterator 441, as shown at row 451-k.

At reference 7.l (e.g., "Load Carry in Comp_Comp"), Carry 437 (e.g., [0x3204080c]) is loaded into the compute components (e.g., stored as Comp_Comp 431), as shown at row 451-l. At reference 7.m (e.g., "Perform AND with Intermediate"), the bit-vector (e.g., [0x3204080c]) stored in the compute components (e.g., stored as Comp_Comp 431) is ANDed with Intermediate 439 (e.g., [0xffff00ff]), where the result of the AND operation (e.g., [0x3204000c]) is in the compute components (e.g., stored as Comp_Comp 431), as shown at row 451-m. At reference 7.n (e.g., "Store in Intermediate"), the result of the AND operation (e.g., [0x3204000c]) is stored as Intermediate 439 (e.g., [0x3204000c] is written over the previously stored bit-vector), as shown at row 451-n. At reference 7.o (e.g., "Store in Carry"), the Comp_Comp 431 (e.g., [0x3204000c]) is stored as Carry 437 (e.g., written over the previous Carry 437).

At reference 7.p (e.g., "Halfadd Intermediate and Dest, Output Dest and Carry"), a half-add operation is performed on Intermediate 439 (e.g., [0x3204000c]) and Dest 449 (e.g., [0x0]). A half-add operation can include performing an XOR operation on a pair of operands and an AND operation on the pair of operands. The result of the XOR operation (e.g., the "sum" of the half-add operation) can be stored in a first location (e.g., stored as Dest 449) and the result of the AND operation (e.g., the "carry" of the half-add operation) can be stored in a second location (e.g., stored as Carry 437).

An XOR operation on two bit-vectors can be performed by a number of NAND, OR, and AND operations. The XOR operation on the two bit-vectors can include performing an AND operation on a result of a NAND operation and a result of an OR operation (e.g., A XOR B=(A OR B) AND (A NAND B)). For example, an XOR operation can be performed on a first bit-vector (e.g., [0011]) and a second bit-vector (e.g., [0110]). The XOR operation includes a NAND operation that can be performed on the first and second bit-vector, resulting in a bit-vector [1101] (e.g., ANDing [0011] and [0110] to result in [0010], and inverting the [0010] bit-vector to result in an XOR result of [1101]). The XOR operation includes an OR operation that can be performed on the first and second bit-vector, resulting in bit-vector [0111] (e.g., ORing [0011] and [0110]). The XOR operation includes an AND operation that can be performed on the result of the NAND operation (e.g., NAND operation result [1101]) and the result of the OR operation (e.g., OR operation result [0111]). The result of the AND operation (e.g., ANDing [1101] and [0111]) is bit-vector [0101], which is the result of an XOR operation performed on the first bit-vector (e.g., [0011]) and the second bit-vector (e.g., [0110]).

The result of the XOR operation (e.g., [0x3204000c]) on Intermediate 439 (e.g., [0x3204000c]) and Dest 449 (e.g., [0x0]) is stored, as shown at row 451-7.p, as Dest 449 (e.g., in a group of memory cells such as memory cells coupled to access line 304-R and sense lines 305-0 to 305-31). The result of the AND operation (e.g., [0x00000000] ANDed with [0x3204000c], resulting in [0x00000000]) is stored as Carry 437 (e.g., stored in memory cells coupled to access line 304-4 and to sense lines 305-0 to 305-31). That is, at row 451-7.p, Carry 437 is [0x00000000] (indicated by [0x0]).

At reference 7.q (e.g., "Load Carry in Comp_Comp"), Carry 437 (e.g., [0x0]) is loaded into the compute components (e.g., stored as Comp_Comp 431), as shown at row 451-7.q. At reference 7.r (e.g., "Do Comp_Comp AND operation with Static_Mask"), the Comp_Comp 431 (e.g., [0x0]) is ANDed with Static_Mask 435 (e.g., [0x777f7f7f]), resulting in [0x0], as shown at row 451-7.r. At reference 7.s (e.g., "Shift Comp_Comp Left"), each bit of the Comp_Comp 431 (e.g., [0x0]) is shifted left, resulting in bit-vector [0x0] (in this example unchanged since there are no "1"s in the bit-vector to shift left).

At reference 7.t (e.g., "For any true bits in Comp_Comp BlockOR"), a secondary loop from reference 7.t.i to 7.t.v is repeatedly performed until there are no "1" bits in the bit-vector stored in the compute components at the end of the secondary loop (e.g., no "1"s in the Comp_Comp 431). At reference 7.t.i (e.g., "Store Comp_Comp in Carry"), the Comp_Comp 431 (e.g., [0x0]) is stored as the Carry 437. At reference 7.t.ii (e.g., "Halfadd Dest and Carry, output Dest and Carry"), a halfadd operation is performed on Dest 449 (e.g., [0x3204000c]) and Carry 437 (e.g., [0x0]). The result of an XOR operation (e.g., [0x3204000c]) performed on Dest 449 (e.g., [0x3204000c]) and Carry 437 (e.g., [0x0]) is stored as Dest 449 (e.g., written over the previously stored bit-vector, in this example being the same bit-vector). The result of an AND operation (e.g., [0x0]) performed on Dest 449 (e.g., [0x3204000c]) and Carry 437 (e.g., [0x0]) is stored as Carry 437. At reference 7.t.iii (e.g., "Load Carry in Comp_Comp"), Carry (e.g., [0x0]) is loaded into the compute components (e.g., stored as Comp_Comp 431). At reference 7.t.iv (e.g, "Do Comp_Comp AND operation with Static_Mask"), the bit-vector (e.g., [0x0]) is ANDed with Static_Mask 435 (e.g., [0x777f7f7f]), resulting in bit-vector [0x0]. At reference 7.t.v (e.g., "Shift Comp_Comp Left"), each bit of the bit-vector stored in the compute components (e.g., stored as Comp_Comp 431) from the AND operation (e.g., bit-vector [0x0]) is shifted left one position, resulting in bit-vector [0x0]. Since reference 7.t.v is the end of the secondary loop from 7.t.i to 7.t.v, the BlockOR operation (described above) is performed to determine if there is a "1" in the Comp_Comp 431. Since there is no "1" in [0x00000000], the secondary loop terminates.

At reference 7.u (e.g., "Load Dynamic_Mask in Comp_Comp"), the Dynamic_Mask bit-vector 433 (e.g.,

[0x11010101]) is loaded into the compute components (e.g., stored as Comp_Comp 431), as shown at row 451-*u* in FIG. 4B. At reference 7.v (e.g., "Shift Left"), each bit of the Comp_Comp 431 (e.g., [0x11010101]) is shifted one position to the left, resulting in bit-vector [0x22020202], as shown at row 451-7.*v*. At reference 7.w (e.g., "Perform AND with Static_Mask"), the bit-vector (e.g., [0x22020202]) stored in the compute components (e.g., stored as Comp_Comp 431) is ANDed with Static_Mask 435 (e.g., [0x777f7f7f]), resulting in bit-vector [0x22020202]. At reference 7.x (e.g., "Store Comp_Comp in Dynamic_Mask"), the Comp_Comp 431 is stored as the Dynamic_Mask bit-vector 433, as shown at row 451-7.*x*.

Since the LOOP including references 7.a to 7.x terminates when a BlockOR determines there is no "1" in the bit-vector stored in the compute components at the end of the LOOP, a BlockOR is performed on the bit-vector (e.g., [0x22020202]) stored in the compute components (e.g., stored as Comp_Comp 431). The BlockOR operation determines that the bit-vector [0x22020202] includes a "1" and the LOOP from references 7.a to 7.x repeats, as described in FIG. 4C.

FIG. 4C illustrates a table showing the states of memory cells of an array at a particular phase associated with performing a multiplication operation in accordance with a number of embodiments of the present disclosure. For example, rows 453-7.*a* to 453-7.*x* of FIG. 4C illustrate the values of the bit-vectors 431, 433, 435, 437, 439, 441, 443, 445, 447, and 449 during a second iteration of the multiplication phase (e.g., a second iteration of the loop corresponding to the pseudocode referenced above by reference number 7). At reference 7.a. (e.g., "Load srcb in Comp_Comp") of the above pseudocode, the srcb bit-vector 445 (e.g., bit-vector [0x33050203]) can be loaded into the appropriate compute components (e.g., compute components 331-0 to 331-31 in this example). For example, the 4 bits corresponding to the first element (e.g., [0x3] or binary [0011]) can be loaded into compute components 331-0 to 331-3 (e.g., with the MSB being loaded into compute component 331-0 and each subsequent next-most-significant bit being loaded into the subsequent corresponding compute components 331-1 to 331-3 such that a "0" is stored in compute components 331-0 and 331-1 and a "1" is stored in compute components 331-2 and 331-3). Subsequent elements (e.g., the second ([0x3], third ([0x05]), fourth ([0x02]), and fifth ([0x03]) element) of the srcb bit-vector 445 can be loaded into subsequent corresponding compute components 331-4 to 331-31. As such, row 453-7.*a* of the table shown in FIG. 4C illustrates the bit vector 431 having a value of [0x33050203].

At reference 7.b (e.g., "Do Comp_Comp AND operation with Dynamic_Mask"), an AND logical operation can be performed on the Comp_Comp 431 (e.g., bit-vector [0x33050203]) shown in row 453-7.*a* (e.g., latched in the compute components 331-0 to 331-31) and Dynamic_Mask 433 (e.g., bit-vector [0x22020202], which can be stored in memory cells coupled to the access line 304-2 and to sense lines 331-0 to 331-31).

Since the value of the srcb bit-vector 445 was loaded into the compute components 331-0 to 331-31, the result of "ANDing" the Comp_Comp 431 with Dynamic_Mask 433 is analogous to the result of performing an AND operation on the srcb bit-vector 445 and the Dynamic_Mask bit-vector 433. As such, bit-vector [0011 0011 00000101 00000010 00000011] (e.g., [0x33050203]) is "ANDed" with bit-vector [0010 0010 00000010 00000010 00000010] (e.g., [0x22020202]), which results in bit-vector [0010 0010 00000000 00000010 00000010] (e.g., [0x22000202]). In a number of examples, the results of the AND logical operation can be retained in the compute components (e.g., 331-0 to 331-31) as the Comp_Comp 431. For instance, row 453-7.*b* illustrates the Comp_Comp 431 as being [0x22000202].

At reference 7.c (e.g., "Store Comp_Comp in Intermediate, Iterator"), the result of the AND operation performed at reference 7.b (e.g., bit-vector [0x22000202]) is stored in (e.g., written to) the memory cells storing Intermediate 439 and in the memory cells storing Iterator 441. As an example, Intermediate 439 can be stored in cells coupled to access line 304-5 and to sense lines 305-0 to 305-31. 53-7.*c* of the table shown in FIG. 4C illustrates Intermediate 439 and Iterator 441 having a value of [0x22000202].

At reference 7.d (e.g., "Secondary LOOP until BlockOR(s) terminates"), a secondary loop corresponding to references 7.d.i. to 7.d.viii. is repeated until there are no "1" bits stored in the compute components (e.g., stored as Comp_Comp 431) at the conclusion of a loop. The secondary loop (e.g., references 7.d.i. to 7.d.viii.) is performed to create a mask to be stored as Intermediate 439. At reference 7.d.i. (e.g., "Load Intermediate in Comp_Comp"), Intermediate 439 (e.g., [0x22000202]) is loaded into the compute components as Comp_Comp 431. At reference 7.d.ii. (e.g., Shift Left), each bit of the bit-vector stored as the Comp_Comp 431 (e.g., [0x22000202]) is shifted one compute component to the left, resulting in bit-vector [44000404] being stored as the Comp_Comp 431. That is, each bit of the first element (e.g., element [0010] or [0x2]) is shifted to the left, resulting in element [0100]. The second element [0010] is shifted to result in [0100], the third element [00000000] is shifted to result in [00000000], the fourth element [00000010] is shifted to result in [00000100], and the fifth element [00000010] is shifted to result in [00000100]. The fifth element's least significant bit (LSB) (e.g., "0") shifts to the left and the LSB position still stores a "0" since there is no bit in a compute component to the right, in this example, to indicate what to shift into that LSB position (e.g., no bit stored in a compute component to the right of the LSB of the fifth element, which would be compute component 331-32 if it was designated).

At reference 7.d.iii (e.g., "Perform OR operation with Intermediate"), an OR operation is performed with the bits of the Comp_Comp 431 (e.g., [0x44000404]) and Intermediate 439 (e.g, [0x22000202]), resulting in bit-vector [0x66000606]. At reference 7.d.iv. (e.g., "Store in Intermediate"), the resulting bit-vector (e.g., [0x66000606]) is stored as Intermediate 439. At reference 7.d.v. (e.g., "Load Iterator in Comp_Comp"), Iterator 441 (e.g., [0x22000202]) is loaded into the compute components as the Comp_Comp 431. At reference 7.d.vi. (e.g., "Shift Left"), each bit of the bit-vector stored as the Comp_Comp 431 (e.g., [0x22000202]) is shifted one compute component to the left, resulting in bit-vector [0x44000404] being stored as the Comp_Comp 431. At reference 7.d.vii. (e.g., "Perform AND with Static_Mask"), the Comp_Comp 431 (e.g., [0x44000404]) is ANDed with Static_Mask 435 (e.g., [0x777f7f7f]), resulting in bit-vector [0x44000404]. At reference 7.d.viii (e.g., "Store in Iterator"), the result of the AND operation (e.g., [0x44000404]) from ANDing [0x44000404] with [0x777f7f7f]) is stored as Iterator 441. Since, at the end of the AND operation, the bit-vector [0x44000404] is retained in the compute components (e.g., Comp_Comp 441), the BlockOR operation at reference 7.d (e.g., "Secondary LOOP until BlockOR(s) terminates") is performed on the bit-vector [0x44000404] to determine if there is a "1" in the Comp_Comp 431. Since bit-vector [0x44000404] contains at least one "1", the LOOP repeats.

The second LOOP of references 7.d.i. to 7.d.viii. includes, at reference 7.d.i, loading Intermediate 439 (e.g., [0x66000606]) into the compute components (e.g., stored as Comp_Comp 431) and, at reference 7.d.ii., performing a left shift. The left shift results in bit-vector [0xcc000c0c]. The result of the left-shift (e.g., [0xcc000c0c]) is ORed, at reference 7.d.iii., with Intermediate 439 (e.g., [0x66000606]), resulting in bit-vector [0xee000e0e]. The resulting bit-vector (e.g., [0xee000e0e]) is stored, at reference 7.d.iv., as Intermediate 439 (e.g., written over the previous Intermediate bit-vector). Iterator 441 (e.g., [0x44000404]) is loaded, at reference 7.d.v., into the compute components (e.g., stored as the Comp_Comp 431). Each bit of Iterator 441 is shifted left, at reference 7.d.vi., resulting in Comp_Comp 431 being [0x88000808]. The resulting Comp_Comp 431 (e.g., [0x88000808]) is ANDed, at reference 7.d.vii., with Static_Mask 435 (e.g., [0x777f7f7f]). The result of the AND operation (e.g., [0x00000808]) is stored, at reference 7.d.viii., as Iterator 441. A BlockOR operation is performed at the end of the second loop and, since the Comp_Comp 431 (e.g., [0x00000808]) includes a "1", the LOOP repeats.

The third LOOP of references 7.d.i to 7.d.viii., results in a left-shifted Intermediate 439 (e.g., [0xdc001c1c]) being ORed with Intermediate 439 (e.g., [0xee000e0e]). The result of the OR operation (e.g., [0xfe001e1e]) is stored as Intermediate 439 (e.g., written over the previous Intermediate bit-vector). Iterator 441 is left-shifted (resulting in [0x00001010]) and ANDed with Static_Mask 435 (e.g., [0x777f7f7f]), resulting in bit-vector [0x00001010], which is stored as Iterator 441. A BlockOR performed on the Comp_Comp 431 (e.g., 0x00001010) results in a repeat of the LOOP. The fourth LOOP of references 7.d.i to 7.d.viii. results in Intermediate 439 being [0xfe003e3e] and Iterator 441 being [0x00002020]. The BlockOR performed on [0x00002020] indicates to repeat the LOOP. The fifth LOOP of references 7.d.i to 7.d.viii. results in Intermediate 439 being [0xfe007e7e] and Iterator 441 being [0x00004040]. The BlockOR performed on [0x00004040] indicates to repeat the LOOP. The sixth LOOP of references 7.d.i to 7.d.viii results in Intermediate 439 being [0xfe00fefe] and Iterator 441 being [0x00000000] (e.g., Iterator [0x00008080] ORed with Static_Mask [0x777f7f7f] results in bit-vector [0x00000000]). The BlockOR performed on [0x00000000] indicates to terminate the LOOP.

At reference 7.e. (e.g., "Load srca in Comp_Comp"), the srca bit-vector 443 (e.g., [0x3204080c]) is loaded into corresponding compute components (e.g., stored as Comp_Comp 431). For example, the bits of the first element of the srca bit-vector (e.g., first element bit-vector [0011]) can be stored in corresponding compute components such that a first and second compute component (e.g., compute components 331-0 and 331-1) store a "0", and a third and fourth compute component (e.g., compute components 331-2 and 331-3) store a "1." In this example, additional compute components (e.g., compute components 331-4 to 331-31) store the second, third, fourth, and fifth elements of the srca bit-vector 443.

At reference 7.f (e.g., "Store in Carry"), the Comp_Comp 431 (e.g., srca bit-vector [0x3204080c]) is stored as Carry 437, as shown at row 453-7.*f*. At reference 7.g (e.g., "Load Dynamic_Mask in Comp_Comp"), Dynamic_Mask 433 (e.g., [0x22020202]), is loaded into the compute components (e.g., stored as Comp_Comp 431), as shown at row 453-7.*g* in FIG. 4C. At reference 7.h (e.g., "Shift Right"), each of the bits of the Comp_Comp 431 (e.g., [0x22020202]) are shifted one compute component to the right, resulting in bit-vector [0x11010101], as shown at row 453-7.*h*. At reference 7.i (e.g., "Perform AND with Static_Mask"), Comp_Comp 431 (e.g., [0x11010101]) is ANDed with Static_Mask 435 (e.g., [0x777f7f7f]). At reference 7.j (e.g., "Store in Iterator"), the result of the AND operation (e.g., bit-vector [0x11010101] is stored as Iterator 441, as shown at row 453-7.*j*.

At reference 7.k (e.g., "Secondary LOOP until Block-OR(s) terminates"), a secondary LOOP including references 7.k.i. to 7.k.vii. is repeated until there are no "1"s stored in the compute components (e.g., the Comp_Comp 431 contains no "1"s). At reference 7.k.i. (e.g., "Load Carry in Comp_Comp"), the secondary loop begins by loading Carry 437 (e.g., [0x3204080c]) into the compute components (e.g., storing as Comp_Comp 431). At reference 7.k.ii (e.g., "Shift Left"), a shift operation is performed that is based on an iteration of the multiplication operation. (e.g., references 7.a to 7.x). For example, during a first iteration of the multiplication operation (e.g., references 7.a to 7.x illustrated by FIG. 4B), the secondary loop (e.g., including references 7.k.i. to 7.k.vii) includes performing zero shifts of the bits of the bit-vector. During a second iteration of the multiplication operation (e.g., references 7.a to 7.x illustrated by FIG. 4C), the secondary loop includes performing one (1) shift to the left for each bit of the bit-vector. For a third iteration of the multiplication operation, each bit shifts two (2) compute components to the left. Since this is the second iteration of the multiplication operation, each of the bits of the bit-vector is shifted left one position. That is, each bit of the bit-vector (e.g., [0x3204080c]) stored in the compute components (e.g., stored as Comp_Comp 431) is shifted left one position, resulting in bit-vector [0x64081018].

At reference 7.k.iii (e.g., "Store in Carry"), the bit-vector (e.g., [0x64081018]) stored in the compute components (e.g., stored as Comp_Comp 431) from the left shift, is stored as Carry 437, as shown at row 453-7.*k*. At reference 7.k.iv (e.g., "Load Iterator in Comp_Comp"), Iterator 441 (e.g., [0x11010101]) is loaded into the compute components (e.g., stored as Comp_Comp 431). At reference 7.k.v (e.g., "Shift Right"), each of the bits of Comp_Comp 431 (e.g., [0x11010101]) shifted to the right (e.g., each bit of [0x11010101] is shifted one position to the right, resulting in [0x08808080]). At reference 7.k.vi. (e.g., "Perform AND with Static_Mask"), the shifted bit-vector (e.g., [0x088080800]) is ANDed with Static_Mask 435 (e.g., [0x777f7f7f]), resulting in bit-vector [0x00000000] (indicated by [0x0]). At reference 7.k.vii (e.g., "Store in Iterator"), the result of the AND operation (e.g., [0x0]) is stored as Iterator 441, as shown at row 453-7.*k*. The secondary loop including references 7.k.i to 7.k.vii terminates once a BlockOR is performed to determine there is no "1" in the bit-vector. That is, a BlockOR is performed on the bit-vector (e.g., [0x00000000]) stored in the compute components (e.g., stored as Comp_Comp 431). Since bit-vector [0x00000000] does not contain a "1", the secondary loop terminates.

At reference 7.l (e.g., "Load Carry in Comp_Comp"), the Carry 437 (e.g., [0x64081018]) is loaded into the compute components (e.g., stored as Comp_Comp 431), as shown at row 453-7.*l*. At reference 7.m (e.g., "Perform AND with Intermediate"), the Comp_Comp 431 (e.g., [0x64081018]) is ANDed with Intermediate 439 (e.g., [0xfe00fefe]), where the result of the AND operation (e.g., [0x64001018]) is retained in the compute components (e.g., stored as Comp_Comp 431), as shown at row 453-7.*m*. At reference 7.n (e.g., "Store in Intermediate"), the result of the AND operation (e.g., [0x64001018]) is stored as Intermediate 439 (e.g., [0x64001018] is written over the previously stored Intermediate bit-vector), as shown at row 453-7.*n*. At reference 7.o (e.g., "Store in Carry"), the Comp_Comp 431 (e.g., [0x64001018]) retained in the compute components is stored as Carry 437, as shown at row 453-7.*o*.

At reference 7.p (e.g., "Halfadd Intermediate and Dest, Output Dest and Carry"), a half-add operation is performed on Intermediate 439 (e.g., [0x64001018]) and Dest 449 (e.g., [0x3204000c]). A half-add operation includes performing an XOR operation and an AND operation. The result of the XOR operation can be stored in a first location (e.g., stored as Dest 449) and the result of the AND operation can be stored in a second location (e.g., stored as Carry 437). The result of the XOR operation (e.g., [0x56041014]) performed on Intermediate 439 (e.g., [0x64001018]) and Dest 449 (e.g., [0x3204000c]) is stored, as shown at row 453-7.*p*, as Dest 449 (e.g., in a group of memory cells such as memory cells coupled to access line 304-R and sense lines 305-0 to 305-31). The result of the AND operation (e.g., [0x64001018] ANDed with [0x3204000c], resulting in [0x20000008]), is stored as Carry 437 (e.g., stored in memory cells coupled to access line 304-4 and to sense lines 305-0 to 305-31). That is, at 453-7.*p*, Carry 437 is [0x20000008].

At reference 7.q (e.g., "Load Carry in Comp_Comp"), Carry 437 (e.g., [0x20000008]) is loaded into the compute components (e.g., stored as Comp_Comp 431), as shown at row 453-7.*q*. At reference 7.r (e.g., "Do Comp_Comp AND operation with Static_Mask"), the bit-vector (e.g., [0x20000008]) stored in the compute components is ANDed with Static_Mask 435 (e.g., [0x777f7f7f]), resulting in [0x20000008], as shown at row 453-7.*r* in the Comp_Comp 431. At reference 7.s (e.g., "Shift Comp_Comp Left"), each bit of the bit-vector stored in the compute components (e.g., [0x20000008]) is shifted left, resulting in bit-vector [0x40000010], as shown at row 453-*s* in the Comp_Comp 431.

At reference 7.t (e.g., "For any true bits in Comp_Comp BlockOR"), a secondary loop from reference 7.t.i to 7.t.v is repeatedly performed until there are no "1" bits in the bit-vector stored in the compute components at the end of the secondary loop. At reference 7.t.i (e.g., "Store Comp_Comp in Carry"), the bit-vector (e.g., [0x40000010]) stored in the compute components (e.g., stored as Comp_Comp 431) are stored as Carry 437. At reference 7.t.ii (e.g., "Halfadd Dest and Carry, output Dest and Carry"), a halfadd operation is performed on Dest 449 (e.g., [0x56041014]) and Carry 437 (e.g., [0x40000010]). The result of an XOR operation (e.g., [0x16041004]) performed on Dest 449 (e.g., [0x56041014]) and Carry 437 (e.g., [0x40000010]) is stored as Dest 449 (e.g., written over the previously stored bit-vector, in this example being the same bit-vector). The result of an AND operation (e.g., [0x40000010]) performed on Dest 449 (e.g., [0x56041014]) and Carry 437 (e.g., [0x40000010]) is stored as Carry 437.

At reference 7.t.iii (e.g., "Load Carry in Comp_Comp"), Carry (e.g., [0x40000010]) is loaded into the compute components (e.g., stored as Comp_Comp 431). At reference 7.t.iv (e.g., "Do Comp_Comp AND operation with Static_Mask"), the bit-vector (e.g., [0x40000010]) stored in the compute components (e.g., stored as Comp_Comp 431) is ANDed with Static_Mask 435 (e.g., [0x777f7f7f]), resulting in bit-vector [0x40000010]. At reference 7.t.v (e.g., "Shift Comp_Comp Left"), each bit of the bit-vector stored in the compute components (e.g., stored as Comp_Comp 431) from the AND operation (e.g., bit-vector [0x40000010]) is shifted left one position, resulting in bit-vector [0x80000020]. Since reference 7.t.v is the end of the secondary loop including references 7.t.i to 7.t.v, the BlockOR operation (described above) is performed to determine if there is a "1" in the bit-vector stored in the compute components. Since there is a "1" in [0x80000020], the secondary loop repeats.

The second loop of the secondary loop including references 7.t.i to 7.t.v includes, at reference 7.t.i (e.g., "Store Comp_Comp in Carry"), storing the bit-vector (e.g., [80000020]) in the compute components (e.g., stored as Comp_Comp 431). At reference 7.t.ii (e.g., "Halfadd Dest and Carry, output Dest and Carry"), an XOR operation and an AND operation is performed on Dest 449 (e.g., [0x16041004]) and Carry 437 (e.g., [0x80000020]). The result of the XOR operation (e.g., [0x96041024]) is stored as Dest 449, as shown at row 453-7.*t*. The result of the AND operation (e.g., [0x0]) is stored as Carry 437, as shown at row 453-*t*. At reference 7.t.iii (e.g., "Load Carry in Comp_Comp"), Carry 437 is loaded into the compute components (e.g., stored as Comp_Comp 431). At reference 7.t.iv (e.g., "Do Comp_Comp AND operation with Static_Mask"), the bit-vector (e.g., [0x0]) stored in the compute components (e.g., stored as Comp_Comp 431) is ANDed with Static_Mask 435 (e.g., [0x777f7f7f]), resulting in [0x0]. At reference 7.t.v (e.g., "Shift Comp_Comp Left"), each of the bits of the bit-vector (e.g., [0x0]) stored in the compute components is shifted to the left one position. Since this is the end of the second loop of the secondary loop including 7.t.i to 7.t.v, the BlockOR operation is performed to determine if there is a "1" in the bit-vector (e.g., [0x0], as shown at row 453-7.*t*) stored in the compute components (e.g., stored as Comp_Comp 431). Since there is no "1" in [0x0], the secondary loop is terminated.

At reference 7.o (e.g., "Load Dynamic_Mask in Comp_Comp"), the Dynamic_Mask bit-vector 433 (e.g., [0x22020202]) is loaded into the compute components (e.g., stored as Comp_Comp 431), as shown at row 453-7.*o* in FIG. 4C. At reference 7.v (e.g., "Shift Left"), each bit of the bit-vector (e.g., [0x22020202]) stored in the compute components (e.g., stored as Comp_Comp 431) is shifted one position to the left, resulting in bit-vector [0x44040404], as shown at row 453-7.*v*. At reference 7.w (e.g., "Perform AND Static_Mask"), the bit-vector (e.g., [0x44040404]) stored in the compute components (e.g., stored as Comp_Comp 431) is ANDed with Static_Mask 435 (e.g., [0x777f7f7f]), resulting in bit-vector [0x44040404]. At reference 7.x (e.g., "Store Comp_Comp in Dynamic_Mask"), the bit-vector (e.g., [0x44040404]) stored in the compute components (e.g., stored as Comp_Comp 431) is stored as the Dynamic_Mask bit-vector 433, as shown at row 453-7.*x*.

Since the LOOP including references 7.a to 7.x terminates when a BlockOR determines there is no "1" in the bit-vector stored in the compute components at the end of the LOOP, a BlockOR is performed on the bit-vector (e.g., [0x44040404]) stored in the compute components (e.g., stored as Comp_Comp 431). The BlockOR operation determines that the bit-vector [0x44040404] includes a "1" and the LOOP from references 7.a to 7.x repeats, as described in FIG. 4D.

FIG. 4D illustrates a table showing the states of memory cells of an array at a particular phase associated with performing a multiplication operation in accordance with a number of embodiments of the present disclosure. For example, rows 455-7.*a* to 455-7.*x* of FIG. 4D illustrate the values of the bit-vectors 431, 433, 435, 437, 439, 441, 443, 445, 447, and 449 during a third iteration of the multiplication phase (e.g., a third iteration of the loop corresponding to the pseudocode referenced above by reference number 7). At reference 7.a. (e.g., "Load srcb in Comp_Comp") of the above pseudocode, the srcb bit-vector 445 (e.g., bit-vector [0x33050203]) can be loaded into the appropriate compute components (e.g., compute components 331-0 to 331-31 in this example), as shown at row 455-7.a in FIG. 4D. For example, the 4 bits corresponding to the first element (e.g., [0x3] or binary [0011]) can be loaded into compute components 331-0 to 331-3 and/or sense amplifiers 306-0 to 306-3 (e.g., with the MSB being loaded into sensing circuitry coupled to sense line 305-0 and each subsequent next-most-significant bit being loaded into the subsequent corresponding compute components 331-1 to 331-3 such that a "0" is stored in compute components 331-0 and 331-1 and a "1" is stored in compute components 331-2 and 331-3). Subsequent elements (e.g., the second ([0x3], third ([0x05]), fourth ([0x02]), and fifth ([0x03]) element) of the srcb bit-vector 445 can be loaded into subsequent corresponding compute components 331-4 to 331-31. As such, row 453-7.a of the table shown in FIG. 4C illustrates the bit vector 431 having a value of [0x33050203].

At reference 7.b (e.g., "Do Comp_Comp AND operation with Dynamic_Mask"), an AND logical operation can be performed on the bit-vector 431 (e.g., bit-vector [0x33050203]) shown in row 455-7.a (e.g., latched in the compute components 331-0 to 331-31) and the Dynamic_Mask bit-vector 433 (e.g., bit-vector [0x44040404], which can be stored in memory cells coupled to the access line 304-2 and to sense lines 331-0 to 331-31).

Since the value of the srcb bit-vector 445 was loaded into the compute components 331-0 to 331-31, the result of "ANDing" the bit-vector 431 with the bit-vector 433 is analogous to the result of performing an AND operation on the srcb bit-vector 445 and the Dynamic_Mask bit-vector 433. As such, bit-vector [0011 0011 00000101 00000010 00000011] (e.g., [0x33050203]) is "ANDed" with bit-vector [0100 0100 00000100 00000100 00000100] (e.g., [0x44040404]), which results in bit-vector [0000 0000 00000100 00000000 00000000] (e.g., [0x00040000]). In a number of examples, the results of the AND logical operation can be retained in the compute components (e.g., 331-0 to 331-31) as bit-vector 431. For instance, row 455-7.b illustrates the Comp_Comp bit-vector 431 as being [0x00040000].

At reference 7.c (e.g., "Store Comp_Comp in Intermediate, Iterator"), the result of the AND operation performed at reference 7.b (e.g., bit-vector [0x00040000]) is stored in (e.g., written to) the memory cells storing Intermediate 439 and in the memory cells storing Iterator 441. As an example, Intermediate 439 can be stored in cells coupled to access line 304-5 and to sense lines 305-0 to 305-31. Row 455-7.c of the table shown in FIG. 4C illustrates Intermediate 439 and Iterator 441 having a value of [0x00040000].

At reference 7.d (e.g., "Secondary LOOP until BlockOR(s) terminates"), a secondary loop including references 7.d.i. to 7.d.viii. is repeated until there are no "1" bits stored in the compute components (e.g., stored as Comp_Comp 431) at the conclusion of a loop. The secondary loop (e.g., references 7.d.i. to 7.d.viii.) is performed to create a mask to be stored as Intermediate 439. At reference 7.d.i. (e.g., "Load Intermediate in Comp_Comp"), Intermediate 439 (e.g., [0x00040000]) is loaded into the Comp_Comp 431 (e.g., compute components 331-0 to 331-31). At reference 7.d.ii. (e.g., Shift Left), each bit of the bit-vector stored in the Comp_Comp 431 (e.g., [0x00040000]) is shifted one compute component to the left, resulting in bit-vector [0x00080000] being stored in the Comp_Comp 431. That is, each bit of the first element (e.g., element [0000] or [0x0]) is shifted to the left, resulting in element [0000]. The second element [0000] is shifted to result in [0000], the third element [00000100] is shifted to result in [00001000], the fourth element [00000000] is shifted to result in [00000000], and the fifth element [00000000] is shifted to result in [00000000]. The fifth element's least significant bit (LSB) (e.g., "0") shifts to the left and the LSB position still stores a "0" since there is no bit in a compute component to the right, in this example, to indicate what to shift into that LSB position (e.g., no bit stored in a compute component to the right of the LSB of the fifth element, which would be compute component 331-32 if it was designated).

At reference 7.d.iii (e.g., "Perform OR operation with Intermediate"), an OR operation is performed with the bit-vector stored in the Comp_Comp 431 (e.g., [0x00080000]) and Intermediate (e.g, [0x00040000]), resulting in bit-vector [0x000c0000]. At reference 7.d.iv. (e.g., "Store in Intermediate"), the resulting bit-vector (e.g., [0x000c0000]) is stored as Intermediate 439. At reference 7.d.v. (e.g., "Load Iterator in Comp_Comp"), Iterator 441 (e.g., [0x00040000]) is loaded into the Comp_Comp 431. At reference 7.d.vi. (e.g., "Shift Left"), each bit of the bit-vector stored in the Comp_Comp 431 (e.g., [0x00040000]) is shifted one compute component to the left, resulting in bit-vector [0x00080000] being stored in the Comp_Comp 431. At reference 7.d.vii. (e.g., "Perform AND with Static_Mask"), the bit-vector (e.g., [0x00080000]) stored in Comp_Comp 431 is ANDed with Static_Mask 435 (e.g., [0x777f7f7f]), resulting in bit-vector [0x00080000]. At reference 7.d.viii (e.g., "Store in Iterator"), the result of the AND operation (e.g., [0x00080000]) from ANDing [0x00080000] with [0x777f7f7f]) is stored as Iterator 441. Since, at the end of the AND operation, the bit-vector [0x00080000] is retained in the compute components (e.g., Comp_Comp 441), the BlockOR operation at reference 7.d (e.g., "Secondary LOOP until BlockOR(s) terminates") is performed with the compute components (e.g., stored as Comp_Comp 431) on the bit-vector [0x00080000] to determine if there is a "1" in the bit-vector. Since bit-vector [0x00080000] contains at least one "1", the LOOP repeats.

The second LOOP of references 7.d.i. to 7.d.viii. includes, at reference 7.d.i, loading Intermediate 439 (e.g., [0x000c0000]) into the compute components (e.g., stored as Comp_Comp 431) and, at reference 7.d.ii., performing a left shift. The left shift results in bit-vector [0x00180000]. The result of the left-shift (e.g., [0x00180000]) is ORed, at reference 7.d.iii., with Intermediate (e.g., [0x000c0000]), resulting in bit-vector [0x001c0000]. The resulting bit-vector (e.g., [0x001c0000]) is stored, at reference 7.d.iv., as Intermediate 439. Iterator 441 (e.g., [0x00080000]) is loaded, at reference 7.d.v., into the Comp_Comp 431. Iterator 441 is shifted left, at reference 7.d.vi., resulting in bit-vector [0x00100000] in Comp_Comp 431. The resulting bit-vector [0x00100000] in Comp_Comp 431 is ANDed, at reference 7.d.vii., with Static_Mask 435 (e.g., [0x777f7f7f]). The result of the AND operation (e.g., [0x00100000]) is stored, at reference 7.d.viii., as Iterator 441. A BlockOR operation is performed at the end of the second loop and, since the [0x00100000] bit-vector is stored in the Comp_Comp 431 and includes a "1", the LOOP repeats.

The third LOOP of references 7.d.i to 7.d.viii., results in a left-shifted Intermediate bit-vector (e.g., [0x00380000]) being ORed with Intermediate (e.g., [0x001c0000]). The result of the OR operation (e.g., [0x003c0000]) is stored as Intermediate 439. Iterator 441 is left-shifted (resulting in [0x00200000]) and ANDed with Static_Mask 435 (e.g., [0x777f7f7f]), resulting in bit-vector [0x00200000] being stored as Iterator 441. A BlockOR performed on the bit-vector [0x00200000] stored in Comp_Comp 431 results in a repeat of the LOOP. The fourth LOOP of references 7.d.i to 7.d.viii. results in a Intermediate bit-vector 439 of [0x007c0000] and a Iterator bit-vector 441 of [0x00400000]. The BlockOR performed on [0x00400000] indicates to repeat the LOOP. The fifth LOOP of references 7.d.i to 7.d.viii. results in a Intermediate bit-vector 439 of [0x00fc0000] and a Iterator bit-vector 441 of [0x00000000] (as Iteratorshifted is [0x00800000], which turns to [0x00000000] when ANDed with Static Mask [0x777f7f7f]). The BlockOR performed on [0x00000000] indicates to terminate the LOOP.

At reference 7.e. (e.g., "Load srca in Comp_Comp"), the srca bit-vector 443 (e.g., [0x3204080c]) is loaded into corresponding compute components (e.g., stored as Comp_Comp 431). For example, the bits of the first element of the srca bit-vector (e.g., first element bit-vector [0011]) can be stored in corresponding compute components such that a first and second compute component (e.g., compute components 331-0 and 331-1) store a "0", and a third and fourth compute component (e.g., compute components 331-2 and 331-3) store a "1." In this example, additional compute components (e.g., compute components 331-4 to 331-31) store the second, third, fourth, and fifth elements of the srca bit-vector 443.

At reference 7.f (e.g., "Store in Carry"), the bit-vector stored in Comp_Comp 431 (e.g., srca bit-vector [0x3204080c]) is stored as Carry 437, as shown at row 455-7.*f*. At reference 7.g (e.g., "Load Dynamic_Mask in Comp_Comp"), the Dynamic_Mask bit-vector 433 (e.g., [0x44040404]), is loaded into the compute components (e.g., stored as Comp_Comp 431), as shown at row 455-7.*g* in FIG. 4D. At reference 7.h (e.g., "Shift Right"), each of the bits of the bit-vector stored in Comp_Comp 431 (e.g., [0x44040404]) are shifted one compute component to the right, resulting in bit-vector [0x22020202], as shown at row 455-7.*h*. At reference 7.i (e.g., "Perform AND with Static Mask"), the bit-vector stored in the Comp_Comp 431 (e.g., [0x22020202]) is ANDed with Static_Mask 435 (e.g., [0x777f7f7f]). At reference 7.j (e.g., "Store in Iterator"), the result of the AND operation (e.g., bit-vector [0x22020202] is stored as Iterator 441, as shown at row 455-7.*j*.

At reference 7.k (e.g., "Secondary LOOP until BlockOR(s) terminates"), a secondary LOOP including references 7.k.i. to 7.k.vii. is repeated until there are no "1"s stored in the compute components (e.g., stored as Comp_Comp 431). At reference 7.k.i. (e.g., "Load Carry in Comp_Comp"), the secondary loop begins by loading Carry 437 (e.g., [0x3204080c]) into the compute components (e.g., stored as Comp_Comp 431). At reference 7.k.ii (e.g., "Shift Left"), a shift operation is performed that is based on an iteration of the multiplication operation. (e.g., references 7.a to 7.x). For example, during a third iteration of the multiplication operation, each bit of Carry 437 (e.g., [0x3204080c]) will be shifted two (2) compute components to the left. During a first loop of the secondary loop including references 7.k.i to 7.k.vii, each of the bits of the bit-vector will be shifted left one position. That is, each bit of the bit-vector (e.g., [0x3204080c]) stored in the compute components (e.g., stored as Comp_Comp 431) is shifted left one position, resulting in bit-vector [0x74081018].

At reference 7.k.iii (e.g., "Store in Carry"), the bit-vector (e.g., [0x74081018]) stored in the compute components (e.g., stored as Comp_Comp 431) from the left shift, is stored as Carry 437, as shown at row 455-7.*k*. At reference 7.k.iv (e.g., "Load Iterator in Comp_Comp"), Iterator 441 (e.g., [0x22020202]) is loaded into the compute components (e.g., stored as Comp_Comp 431). At reference 7.k.v (e.g., "Shift Right"), each of the bits of the bit-vector (e.g., [0x22020202]) loaded in the Comp_Comp 431 is shifted to the right (e.g., each bit of [0x22020202] is shifted one position to the right, resulting in [0x11010101]). At reference 7.k.vi. (e.g., "Perform AND with Static_Mask"), the shifted bit-vector (e.g., [0x11010101]) is ANDed with Static_Mask 435 (e.g., [0x777f7f7f]), resulting in bit-vector [0x11010101]. At reference 7.k.vii (e.g., "Store in Iterator"), the result of the AND operation (e.g., [0x11010101]) is stored as Iterator 441, as shown at row 455-7.*k*. A BlockOR is performed at the end of the first secondary loop (e.g., including references 7.k.i to 7.k.vii) on the bit-vector (e.g., [0x11010101]) stored in the compute components (e.g., stored as Comp_Comp 431). The bit-vector [0x11010101] includes a "1", so the secondary loop repeats.

At reference 7.k.i. (e.g., "Load Carry in Comp_Comp"), the second loop begins by loading Carry 437 (e.g., [0x74081018]) into the compute components (e.g., stored as Comp_Comp 431). At reference 7.k.ii (e.g., "Shift Left"), each bit of the bit-vector (e.g., [0x74081018]) stored in the compute components (e.g., stored as Comp_Comp 431) is shifted left one position, resulting in bit-vector [0xc8102030].

At reference 7.k.iii (e.g., "Store in Carry"), the bit-vector (e.g., [0xc8102030]) stored in the compute components (e.g., stored as Comp_Comp 431) from the left shift, is stored as Carry 437, as shown at 55-7.*k*. At reference 7.k.iv (e.g., "Load Iterator in Comp_Comp"), Iterator 441 (e.g., [0x11010101]) is loaded into the compute components (e.g., stored as Comp_Comp 431). At reference 7.k.v (e.g., "Shift Right"), each of the bits of the bit-vector (e.g., [0x08808080]) loaded in the Comp_Comp 431 is shifted to the right (e.g., each bit of [0x11010101] is shifted one position to the right, resulting in [0x08808080]). At reference 7.k.vi. (e.g., "Perform AND with Static_Mask"), the shifted bit-vector (e.g., [0x08808080]) is ANDed with Static_Mask 435 (e.g., [0x777f7f7f]), resulting in bit-vector [0x00000000]. At reference 7.k.vii (e.g., "Store in Iterator"), the result of the AND operation (e.g., [0x00000000]) is stored as Iterator 441, as shown at row 455-7.*k*. A BlockOR is performed at the end of the first secondary loop (e.g., including references 7.k.i to 7.k.vii) on the bit-vector (e.g., [0x00000000], indicated by [0x0]) stored in the compute components (e.g., stored as Comp_Comp 431). For example, the bit-vector [0x0] is stored in the compute components (e.g., stored as Comp_Comp 431) shown at row 455-7.*k* and the compute components perform the BlockOR on the bits of the [0x0] bit-vector. Since there are no "1"s in the [0x00000000] bit-vector, the secondary loop terminates.

At reference 7.l (e.g., "Load Carry in Comp_Comp"), Carry 437 (e.g., [0xc8102030]) is loaded into the compute components (e.g., stored as Comp_Comp 431), as shown at row 455-7.*l*. At reference 7.m (e.g., "Perform AND with Intermediate"), the bit-vector (e.g., [0xc8102030]) stored in the compute components (e.g., stored as Comp_Comp 431) is ANDed with Intermediate (e.g., [0x00fc0000]), where the result of the AND operation (e.g., [0x00100000]) is retained in the compute components (e.g., stored as Comp_Comp 431), as shown at row 455-7.*m*. At reference 7.n (e.g., "Store in Intermediate"), the result of the AND operation (e.g.,

[0x00100000]) is stored as Intermediate 439 (e.g., [0x00100000] is written over the previously stored bit-vector), as shown at row 455-7.n. At reference 7.o (e.g., "Store in Carry"), the bit-vector (e.g., [0x00100000]) retained in the compute components (e.g., stored as Comp_Comp 431) is stored as Carry 437, as shown at row 455-7.o.

At reference 7.p (e.g., "Halfadd Intermediate and Dest, Output Dest and Carry"), a half-add operation is performed on Intermediate 439 (e.g., [0x00100000]) and Dest 449 (e.g., [0x96041024]). A half-add operation includes performing an XOR operation and an AND operation. The result of the XOR operation can be stored in a first location (e.g., stored as Dest 449) and the result of the AND operation can be stored in a second location (e.g., stored as Carry 437). The result of the XOR operation (e.g., [0x96141024]) performed on Intermediate 439 (e.g., [0x00100000]) and Dest 449 (e.g., [0x96041024]) is stored, as shown at row 455-7.p, as Dest 449 (e.g., in a group of memory cells such as memory cells coupled to access line 304-R and sense lines 305-0 to 305-31). The result of the AND operation (e.g., [0x96041024] ANDed with [0x00100000], resulting in [0x00000000]), is stored as Carry 437 (e.g., stored in memory cells coupled to access line 304-4 and to sense lines 305-0 to 305-31). That is, at row 455-7.p, Carry 437 is [0x0] (indicating [0x000000]).

At reference 7.q (e.g., "Load Carry in Comp_Comp"), Carry 437 (e.g., [0x00000000], indicated by [0x0]) is loaded into the compute components (e.g., stored as Comp_Comp 431), as shown at row 455-7.q. At reference 7.r (e.g., "Do Comp_Comp AND operation with Static_Mask"), the bit-vector (e.g., [0x0]) stored in the compute components is ANDed with Static Mask 435 (e.g., [0x777f7f7f]), resulting in [0x0], as shown in the Comp_Comp 431 at row 455-7.r. At reference 7.s (e.g., "Shift Comp_Comp Left"), each bit of the bit-vector stored in the compute components (e.g., [0x0]) is shifted left, resulting in bit-vector [0x0], as shown at row 455-s in the Comp_Comp 431.

At reference 7.t (e.g., "For any true bits in Comp_Comp BlockOR"), a secondary loop from reference 7.t.i to 7.t.v is repeatedly performed until there are no "1" bits in the bit-vector stored in the compute components at the end of the secondary loop. At reference 7.t.i (e.g., "Store Comp_Comp in Carry"), the bit-vector (e.g., [0x0]) stored in the compute components (e.g., stored as Comp_Comp 431) are stored as Carry 437. At reference 7.t.ii (e.g., "Halfadd Dest and Carry, output Dest and Carry"), a halfadd operation is performed on Dest 449 (e.g., [0x96141024]) and Carry 437 (e.g., [0x0]). The result of an XOR operation (e.g., [0x96141024]) performed on Dest 449 (e.g., [0x96141024]) and Carry 437 (e.g., [0x0]) is stored as Dest 449 (e.g., written over the previously stored bit-vector, in this example being the same bit-vector). The result of an AND operation (e.g., [0x0]) performed on Dest 449 (e.g., [0x96141024]) and Carry 437 (e.g., [0x0]) is stored as Carry 437.

At reference 7.t.iii (e.g., "Load Carry in Comp_Comp"), Carry (e.g., [0x0]) is loaded into the compute components (e.g., stored as Comp_Comp 431). At reference 7.t.iv (e.g., "Do Comp_Comp AND operation with Static_Mask"), the bit-vector (e.g., [0x0]) stored in the compute components (e.g., stored as Comp_Comp 431) is ANDed with Static_Mask 435 (e.g., [0x777f7f7f]), resulting in bit-vector [0x0]. At reference 7.t.v (e.g., "Shift Comp_Comp Left"), each bit of the bit-vector stored in the compute components (e.g., stored as Comp_Comp 431) from the AND operation (e.g., bit-vector [0x0]) is shifted left one position, resulting in bit-vector [0x0]. Since reference 7.t.v is the end of the secondary loop including references 7.t.i to 7.t.v, the BlockOR operation (described above) is performed to determine if there is a "1" in the bit-vector stored in the compute components. Since there is no "1" in [0x0], the secondary loop terminates.

At reference 7.u (e.g., "Load Dynamic_Mask in Comp_Comp"), the Dynamic_Mask bit-vector 433 (e.g., [0x44040404]) is loaded into the compute components (e.g., stored as Comp_Comp 431), as shown at row 455-7.u in FIG. 4D. At reference 7.v (e.g., "Shift Left"), each bit of the bit-vector (e.g., [0x44040404]) stored in the compute components (e.g., stored as Comp_Comp 431) is shifted one position to the left, resulting in bit-vector [0x88080808], as shown at row 453-7.v. At reference 7.w (e.g., "Perform AND Static_Mask"), the bit-vector (e.g., [0x88080808]) stored in the compute components (e.g., stored as Comp_Comp 431) is ANDed with Static_Mask 435 (e.g., [0x777f7f7f]), resulting in bit-vector [0x00080808]. At reference 7.x (e.g., "Store Comp_Comp in Dynamic_Mask"), the bit-vector (e.g., [0x00080808]) stored in the compute components (e.g., stored as Comp_Comp 431) is stored as the Dynamic_Mask bit-vector 433, as shown at row 455-7.x.

Since the LOOP including references 7.a to 7.x terminates when a BlockOR determines there is no "1" in the bit-vector stored in the compute components at the end of the LOOP, a BlockOR is performed on the bit-vector (e.g., [0x00080808]) stored in the compute components (e.g., stored as Comp_Comp 431). The BlockOR operation determines that the bit-vector [0x00080808] includes a "1" and the LOOP corresponding to reference number 7 (e.g., references 7.a to 7.x) repeats for a number of subsequent iterations. Results of subsequent iterations are indicated below; however, the details are not described since the subsequent iterations do not change the value of Dest 449 (e.g., [0x96141024]), which stores the result of the multiplication operation (e.g., a bit-vector representing the products of the element pairs). For instance, during execution of a fourth iteration, the Dynamic_Mask 433 has a value of [0x00080808], during execution of a fifth iteration, the Dynamic_Mask 433 has a value of [0x00101010], during execution of a sixth iteration, the Dynamic Mask 433 has a value of [0x00202020], during execution of a seventh iteration, the Dynamic_Mask 433 has a value of [0x00404040], and during execution of an eighth iteration, the Dynamic_Mask 433 has a value of [0x00000000] (as the Dynamic_Mask bit-vector of [0x00808080] is ANDed with Static_Mask [0x777f7f7f], resulting in bit-vector [0x00000000]). The Dynamic_Mask bit-vector of [0x00000000] is loaded into the compute components and the BlockOR is performed. Since the value of Comp_Comp 431 is [0x00000000] (indicated by [0x0]), the BlockOR returns a "0" and the loop terminates.

Since a product of the two bit-vectors (e.g., srca bit-vector 443 [0x3204080c] and srcb bit-vector 445 [0x33050203] was determined after three (3) iterations, the fourth through eighth iteration will continue with Dest having the same value (e.g., [0x96141024]), as there is no further carry values to add into the product. The number of iterations corresponds to the fixed width of the bit-vector being multiplied (i.e., a bit-width of 8 bits in this example for each element multiplied). The resultant bit-vector [0x96141024] is a product of bit-vectors [0x3204080c] and [0x33050203]. That is, a first element [0x3] of the first bit-vector [0x3204080c] multiplied by a first element [0x3] of the second bit-vector [0x33050203] results in a first product element of [0x9] (e.g., the first element of the result bit-vector [0x96141024], stored as Dest 447 at row 455-7.x). A second element [0x2] of the first bit-vector multiplied by a second element [0x3] of the second bit-vector results in a second product element of [0x6]. A third element [0x04] of the first bit-vector multiplied by a third element [0x05] of the second bit-vector results in a third product element of [0x14] (which represents a numerical base ten (10) value of 20). A fourth element [0x08] of the first bit-vector multiplied by a fourth element [0x02] of the second bit-vector results in a fourth product element of [0x10] (which represents a numerical base ten (10) value of 16). A fifth element [0x0c] of the first bit-vector multiplied by a fifth element [0x03] of the second bit-vector results in a fifth product element of [0x24] (which represents a numerical base ten (10) value of 36).

Figure 5A:
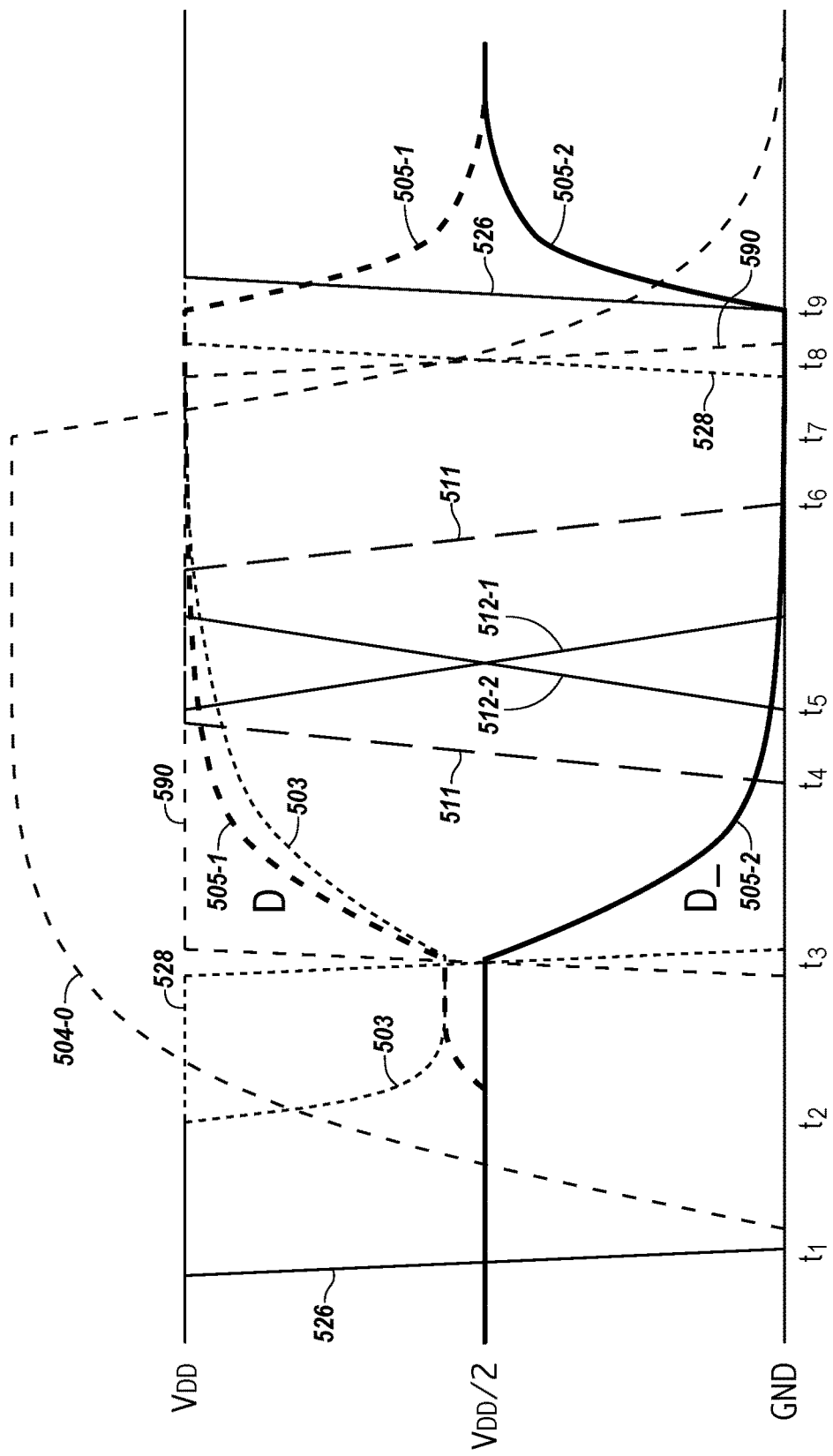
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground).

In the example illustrated in FIG. 5a, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy, since the energy associated with enabling/disabling the row signal 504-0 can be amortized over the plurality of memory cells coupled to the row.

At time $t_3$, the sense amplifier (e.g., 206 shown in FIG. 2A) is enabled (e.g., a positive control signal 590 (e.g., corresponding to ACT 265 shown in FIG. 2B) goes high and the negative control signal 528 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the accumulator positive control signal 512-1 (e.g., Accumb) and the accumulator positive control signal 512-2 (e.g., Accum) are activated via respective control lines 212-1 and 212-2 shown in FIG. 2A. As described below, the accumulator control signals ACCUMB 1412-1 and ACCUM 512-2 may remain activated for subsequent operation phases. As such, in this example, activating the control signals ACCUMB 512-1 and ACCUM 512-2 enables the secondary latch (e.g., accumulator) of compute component 231 shown in FIG. 2A. The sensed data value stored in sense amplifier 206 is transferred (e.g., copied) to the secondary latch, including the dynamic latch and latch 264.

At time $t_6$, the Passd control signal 511 (and the Passdb control signal) goes low thereby turning off the pass transistors (if present). However, since the accumulator control signals ACCUMB 512-1 and ACCUM 512-2 remain activated, an accumulated result is stored (e.g., latched) in the secondary latches (e.g., accumulator). At time $t_7$, the row signal 504-0 is deactivated, and the array sense amps are disabled at time $t_8$ (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
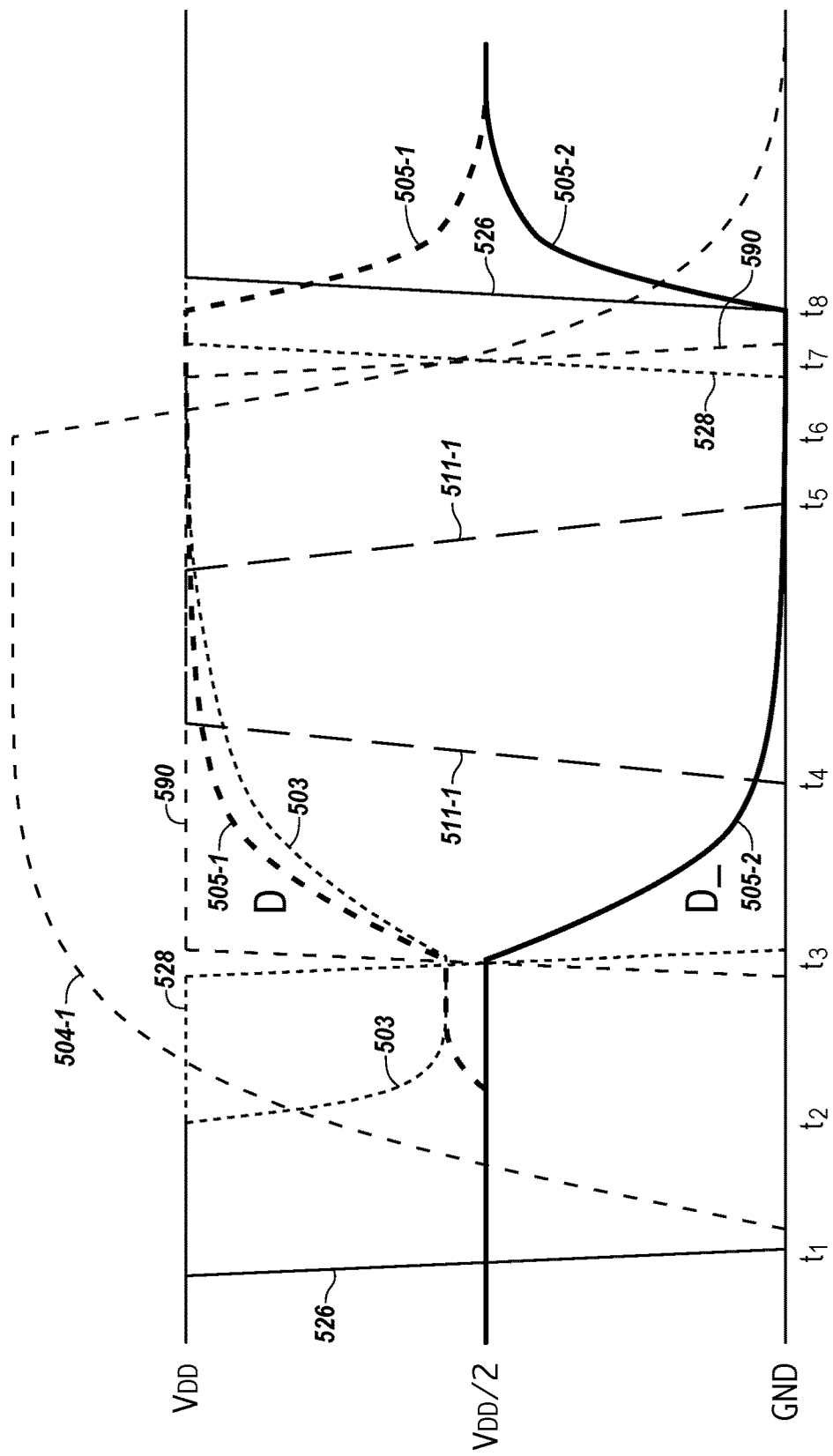
Figure 5C:
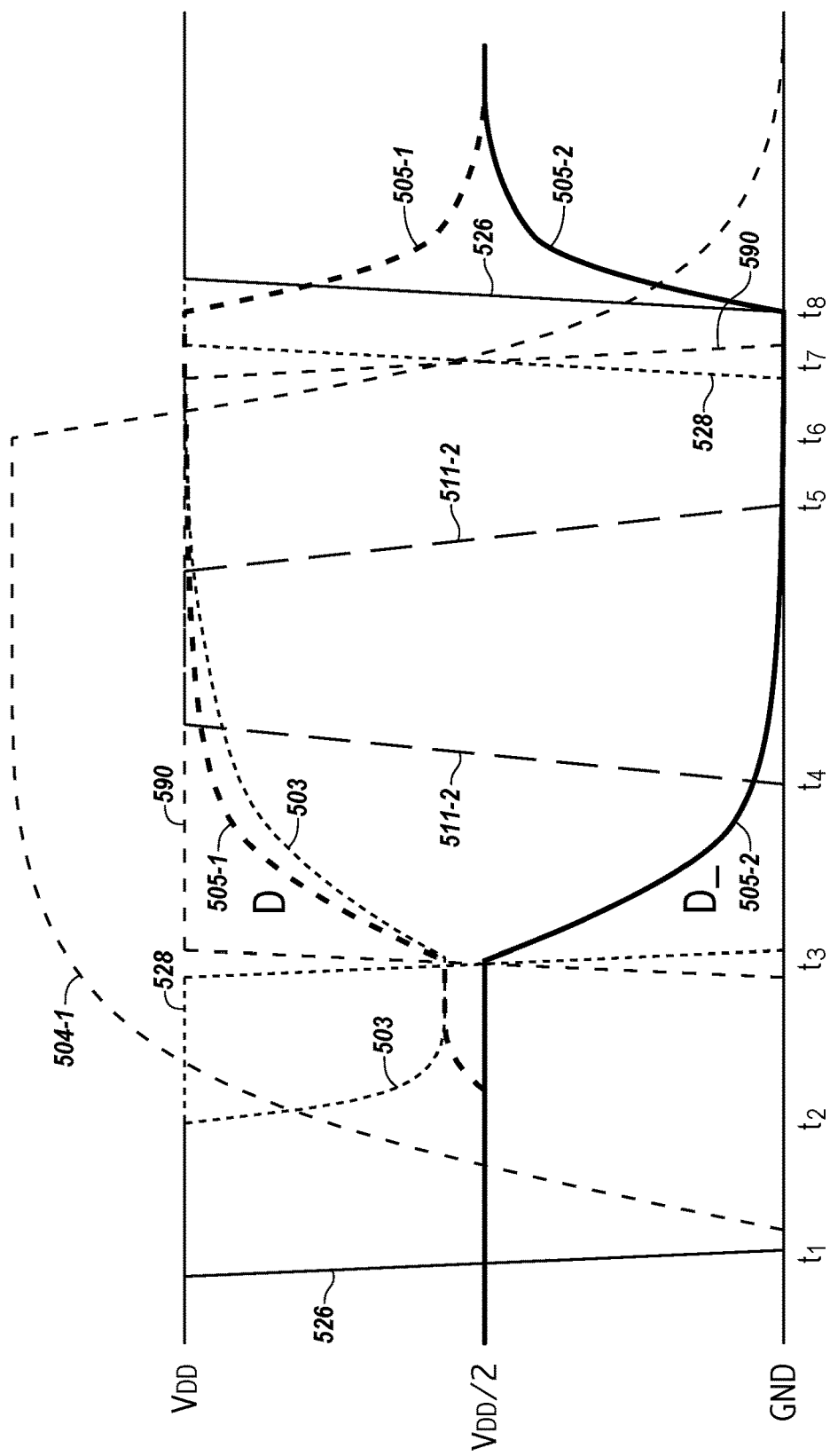

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to FIG. 5C one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy, since the energy associated with activating/deactivating the row signal 504-1 can be amortized over the plurality of memory cells coupled to the row.

At time $t_3$, the sense amplifier (e.g., 206 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 512-1 (Accumb) and 512-2 (Accum) were activated during the initial operation phase described with respect to FIG. 5A, and they remain activated during the intermediate operation phase(s).

Since the accumulator was previously enabled, activating only Passd (511-1 as shown in FIG. 5B) results in accumulating the data value corresponding to the voltage signal 505-1 shown in FIG. 5B corresponding to data line D. Similarly, activating only Passdb (511-2 as shown in FIG. 5C) results in accumulating the data value corresponding to the voltage signal 505-2 corresponding to data line D_. For instance, in an example AND/NAND operation shown in the timing diagram illustrated in FIG. 5B in which only Passd (511-1) is activated, if the data value stored in the second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 5C in which only Passdb 511-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 505-2 on D_ is setting the true data value of the accumulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 5B or 5C can be repeated in order to accumulate results from a number of additional rows. As an example, the sequence of timing diagram illustrated in FIGS. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
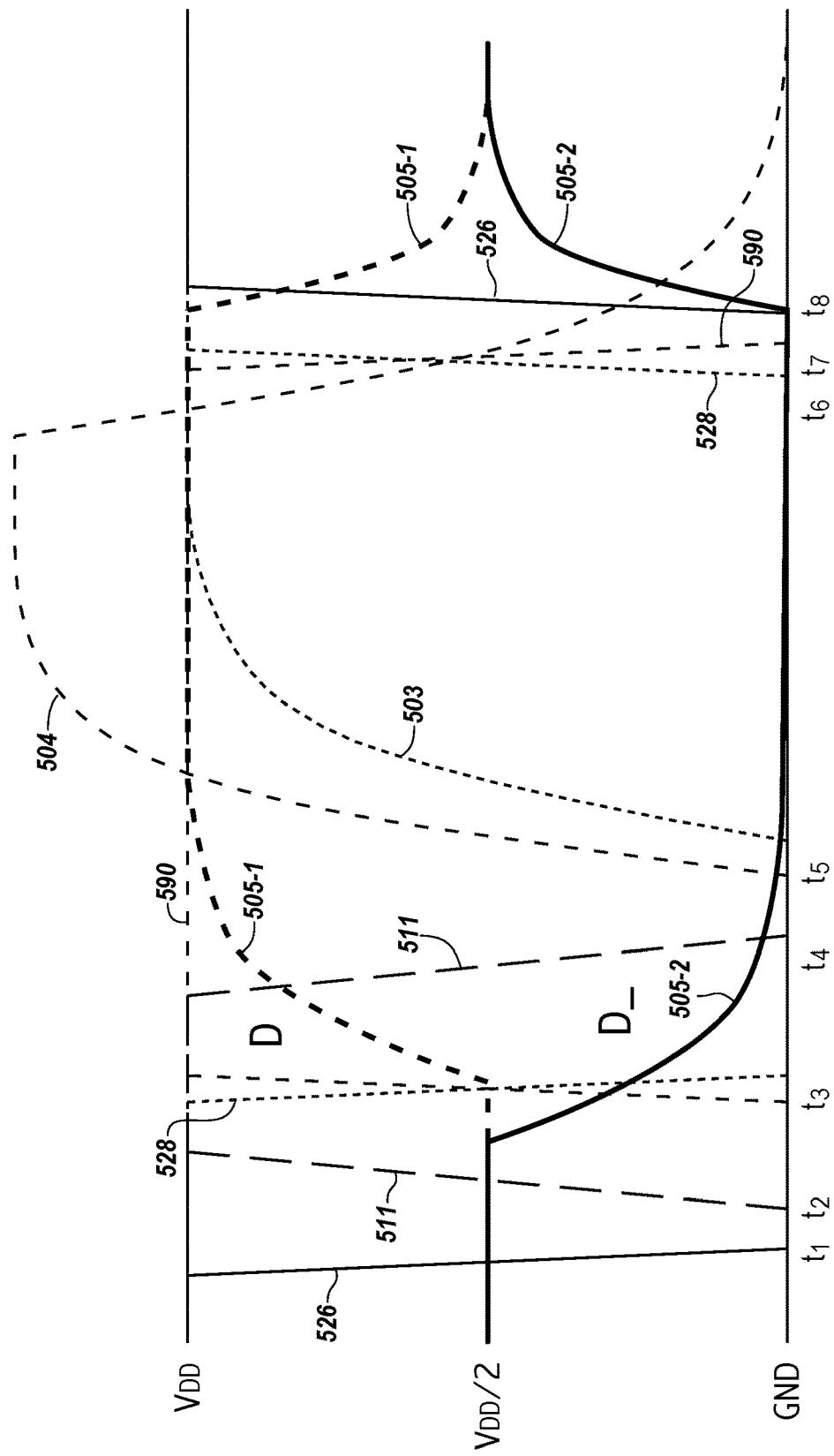

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 3 shown below indicates the Figures corresponding to the sequence of operation phases associated with performing a number of R-input logical operations in accordance with a number of embodiments described herein.

TABLE 3

| Operation | FIG. 5A | FIG. 5B | FIG. 5C | FIG. 5D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time $t_2$, the Passd control signal 511 (and Passdb signal) is activated for an AND or OR operation.

Activating the Passd control signal 511 (and Passdb signal) (e.g., in association with an AND or OR operation) transfers the accumulated output stored in the secondary latch of compute component 231 shown in FIG. 2A to the primary latch of sense amplifier 206. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 265 (e.g., corresponding to ACT 265 shown in FIG. 2B) goes high and the negative control signal 528 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time t7, the positive control signal 590 and the negative control signal 528 being deactivated (e.g., signal 590 goes low and signal 528 goes high) to disable the sense amplifier 206 shown in FIG. 2A. At time t4 the Passd control signal 511 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after he Passd control signal 511 (and Passdb signal) are deactivated).

As shown in FIG. 5D, at time t5, a selected row is enabled (e.g., by row activation signal 504 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 528 and negative control signal 590 are deactivated in FIG. 5D), and at time t8 equilibration occurs (e.g., signal 526 is activated and the voltages on the complementary data lines 505-1 (D) and 505-2 (D_) are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 (D) and/or 205-2 (D_)).

Figure 6A:
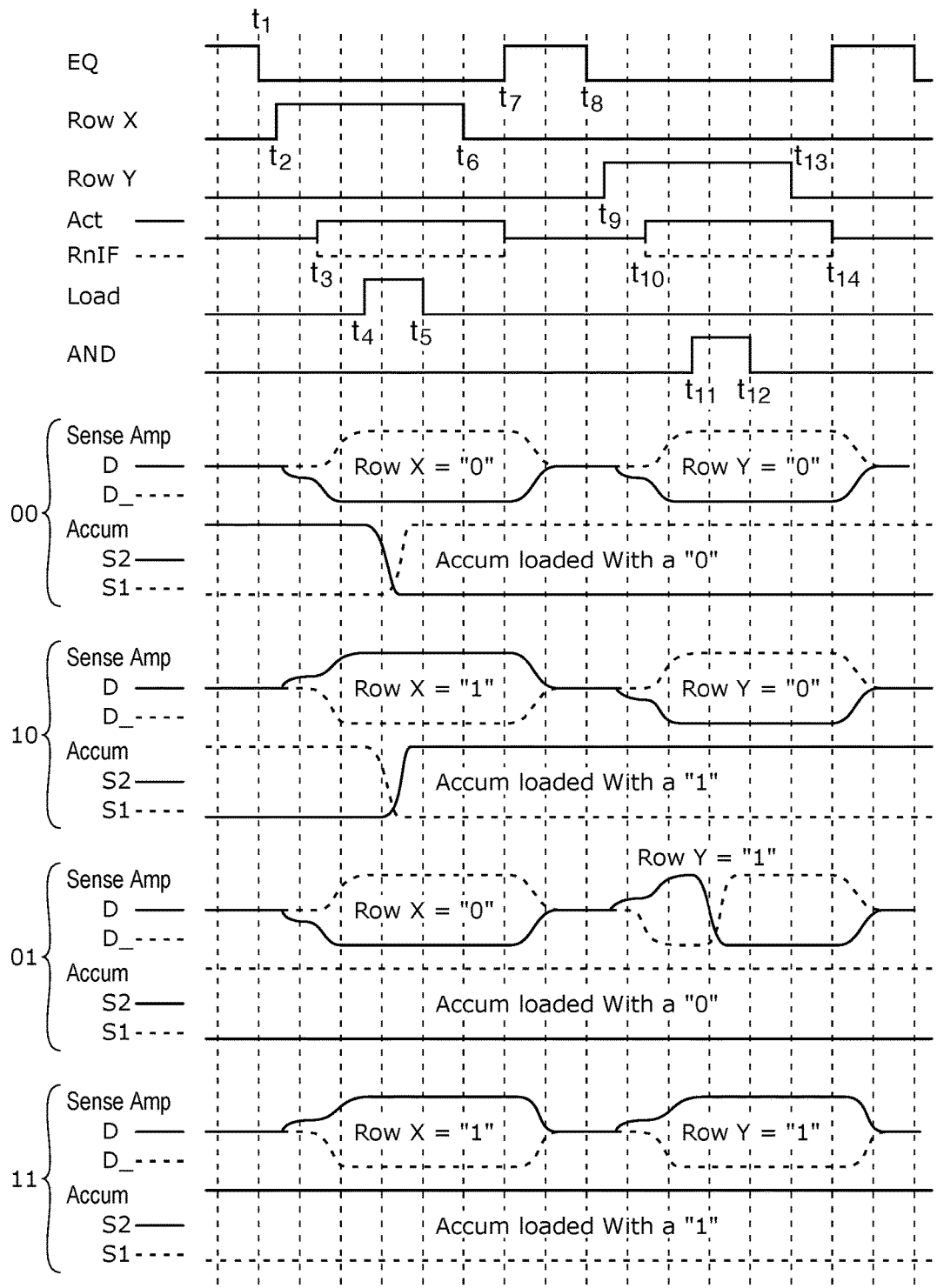
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250 in FIG. 2A) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" corresponds to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:

```
Copy Row X into the Accumulator:
    Deactivate EQ;
    Open Row X;
    Fire Sense Amps (after which Row X data resides in the sense amps);
        Activate LOAD (sense amplifier data (Row X) is transferred to nodes
    S1 and S2 of the Accumulator and resides there dynamically);
        Deactivate LOAD;
        Close Row X;
        Precharge;
```

In the pseudo code above, "Deactivate EQ" indicates that an equilibration signal (EQ signal shown in FIG. 6A) corresponding to the sense amplifier 206 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 6A. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled, in the pseudo code above, "Fire Sense Amps" indicates that the sense amplifier 206 is enabled to set the primary latch and subsequently disabled. For example, as shown at $t_3$ in FIG. 6A, the ACT positive control signal (e.g., 265 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-2 and access transistor 202-2, corresponding to Row X, is coupled to the complementary data line D_, while the memory cell including storage element 203-1 and access transistor 202-1, corresponding to Row Y, is coupled to data line D. However, as can be seen in FIG. 2A, the charge stored in the memory cell comprising access transistor 202-2 (corresponding to Row X) corresponding to a "0" data value causes the voltage on data line D_ (to which access transistor 202-2 is coupled) to go high and the charge stored in the memory cell comprising access transistor 202-2 corresponding to a "1" data value causes the voltage on data line D_ to go low, which is opposite correspondence between data states and charge stored in the memory cell corresponding to access transistor 202-1, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 6A to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231 shown in FIG. 2A) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

```
Deactivate EQ;
Open Row Y;
Fire Sense Amps (after which Row Y data resides in the sense amps);
Close Row Y;
    The result of the logic operation, in the next operation, will be placed
on the sense amp, which will overwrite any row that is active;
    Even when Row Y is closed, the sense amplifier still contains the
Row Y data value;
    Activate AND;
    This results in the sense amplifier being written to the value of the
function (e.g., Row X AND Row Y);
    If the accumulator contains a "0" (i.e., a voltage corresponding to a
"0" on node S2 and a voltage corresponding to a "1" on node S1), the sense
amplifier data is written to a "0";
    If the accumulator contains a "1" (i.e., a voltage corresponding to a
"1" on node S2 and a voltage corresponding to a "0" on node S1), the sense
amplifier data remains unchanged (Row Y data);
    This operation leaves the data in the accumulator unchanged.
Deactivate AND;
Precharge;
```

In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 6A, the ACT positive control signal (e.g., 265 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 6A at $t_{11}$, causing pull-down transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pull-down transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 6A, causing pull-down transistor 207-1 to stop conducting to isolate the sense amplifier 206 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
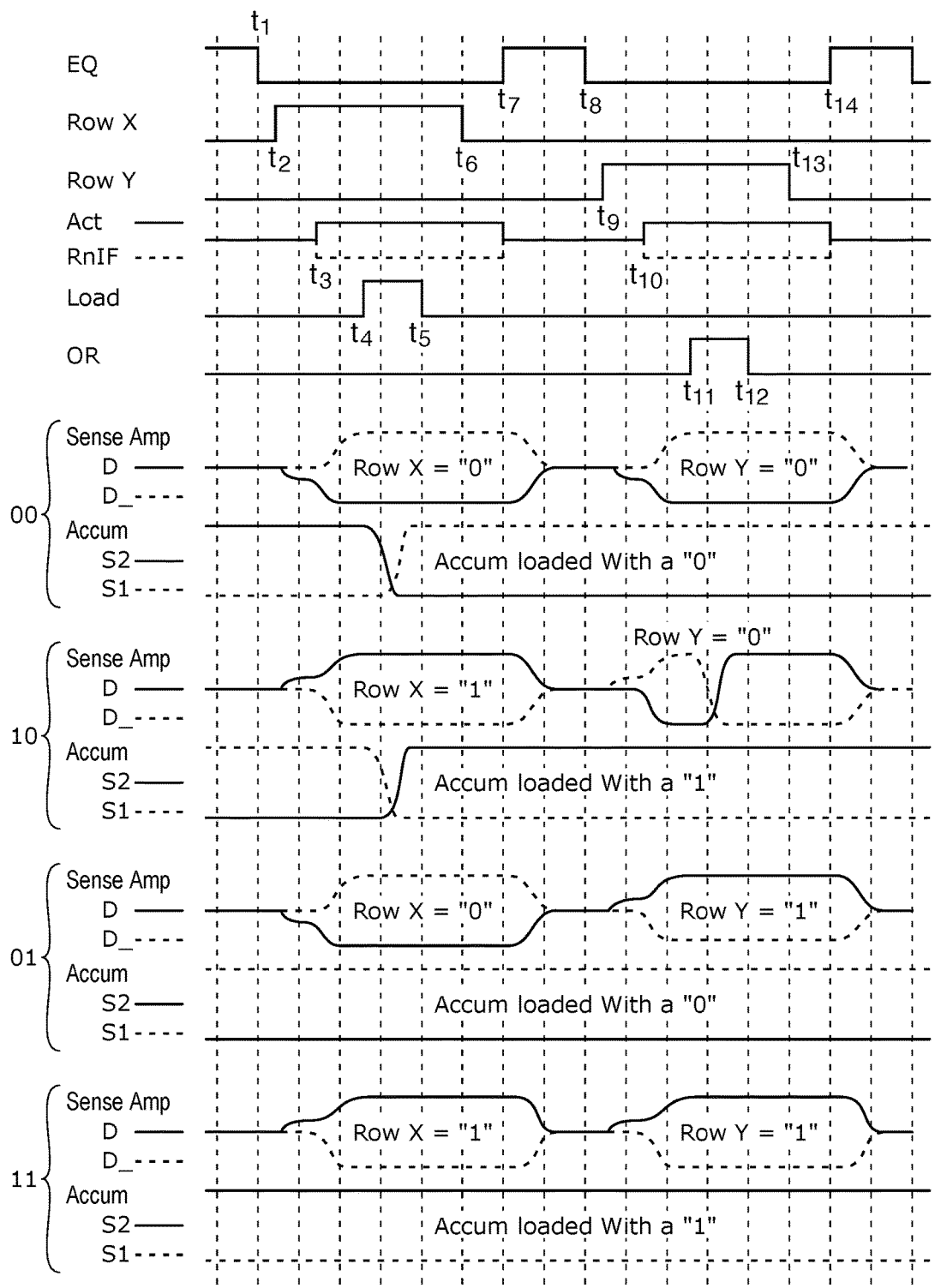

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

>     Deactivate EQ;
>     Open Row Y;
>     Fire Sense Amps (after which Row Y data resides in the sense amps);
>     Close Row Y;
>         When Row Y is closed, the sense amplifier still contains the Row Y data value;
>     Activate OR;
>         This results in the sense amplifier being written to the value of the function (e.g., Row X OR Row Y), which may overwrite the data value from Row Y previously stored in the sense amplifier as follows:
>         If the accumulator contains a "0" (i.e., a voltage corresponding to a "0" on node S2 and a voltage corresponding to a "1" on node S1), the sense amplifier data remains unchanged (Row Y data);
>         If the accumulator contains a "1" (i.e., a voltage corresponding to a "1" on node S2 and a voltage corresponding to a "0" on node S1), the sense amplifier data is written to a "1";
>             This operation leaves the data in the accumulator unchanged;
>     Deactivate OR;
>     Precharge;

The "Deactivate EQ" (shown at $t_8$ in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pull-down transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pull-down transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pull-down transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pull-down transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 6B shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 6B, causing pull-down transistor 207-2 to stop conducting to isolate the sense amplifier 206 (and data line D 205-2) from ground. If not previously done, Row Y can be closed (as shown at $t_{13}$ in FIG. 6B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ANDinv control signal causes transistor 214-1 to conduct and activating the ORinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ANDinv control signal causes transistor 214-1 to conduct and activating the ORinv control signal causes transistor 214-2 to conduct. The ORinv and/or ANDinv control signals are used in implementing the NOT function, as described further below:

```
Copy Row X into the Accumulator;
    Deactivate EQ;
    Open Row X;
    Fire Sense Amps (after which Row X data resides in the sense amps);
    Activate LOAD (sense amplifier data (Row X) is transferred to nodes
S1 and S2 of the Accumulator and resides there dynamically;
    Deactivate LOAD;
    Activate ANDinv and ORinv (which puts the compliment data value
on the data lines);
        This results in the data value in the sense amplifier being
inverted (e.g., the sense amplifier latch is flipped);
        This operation leaves the data in the accumulator unchanged;
    Deactivate ANDinv and ORinv;
    Close Row X;
    Precharge;
```

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a compliment version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

```
Deactivate Norm and Activate Shift;
Deactivate EQ;
Open Row X;
Fire Sense Amps (after which shifted Row X
data resides in the sense amps);
Activate Norm and Deactivate Shift;
Close Row X;
Precharge;
```

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above. Operations to shift left Row X can be summarized as follows:

---
Activate Norm and Deactivate Shift;
Deactivate EQ;
Open Row X;
Fire Sense Amps (after which Row X data resides in the sense amps);
Deactivate Norm and Activate Shift;
    Sense amplifier data (shifted left Row X) is transferred to Row X;
Close Row X;
Precharge;

---

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 7:
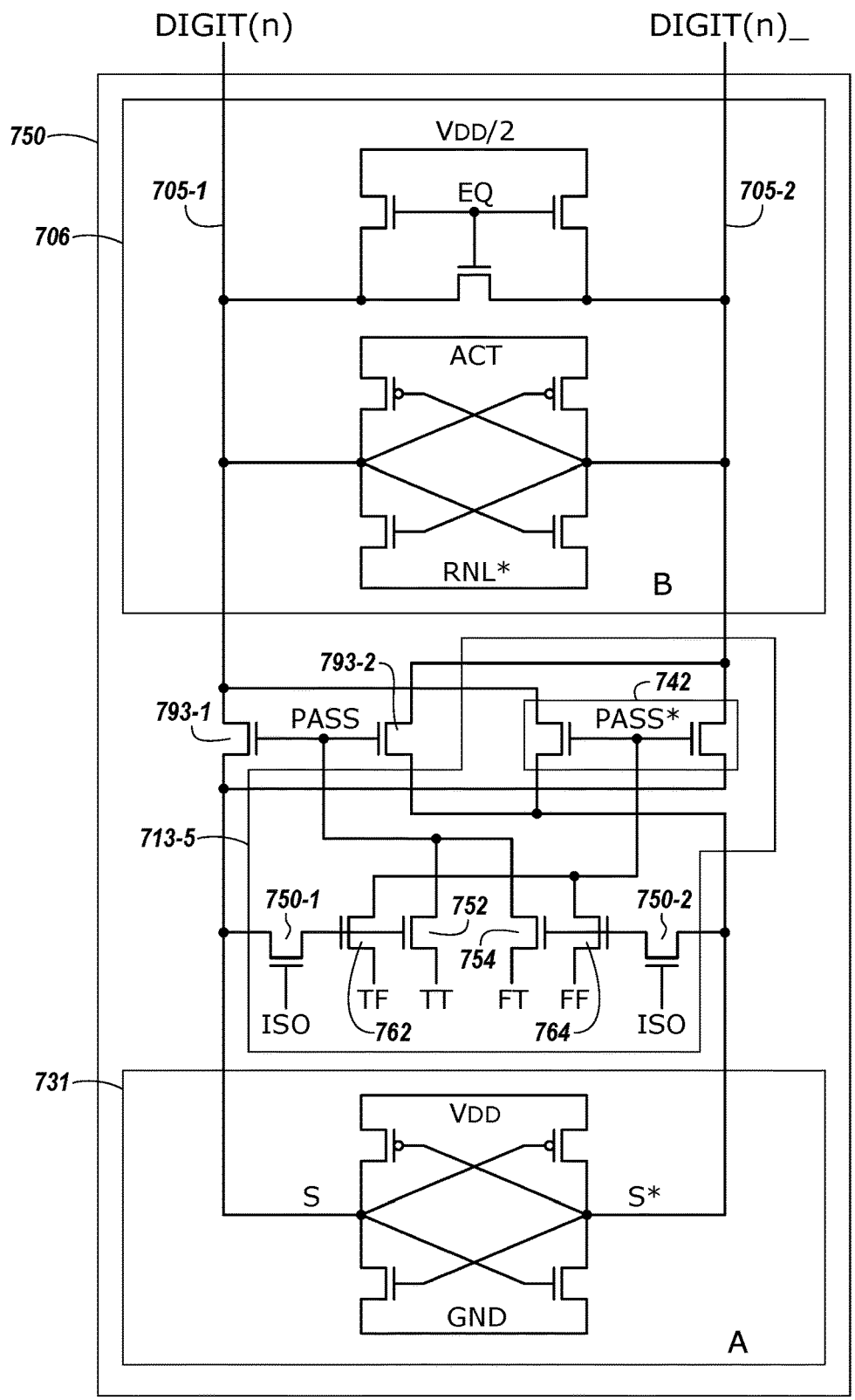
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a sense amplifier 706 coupled to a pair of complementary sense lines 705-1 and 705-2, and a compute component 731 coupled to the sense amplifier 706 via pass gates 793-1 and 793-2. The gates of the pass gates 793-1 and 793-2 can be controlled by a logical operation selection logic signal, PASS, which can be output from logical operation selection logic 713-5. FIG. 7 shows the compute component 731 labeled "A" and the sense amplifier 706 labeled "B" to indicate that the data value stored in the compute component 731 is the "A" data value and the data value stored in the sense amplifier 706 is the "B" data value shown in the logic tables illustrated with respect to FIG. 8.

The sensing circuitry 750 illustrated in FIG. 7 includes logical operation selection logic 713-5. In this example, the logic 713-5 comprises swap gates 742 controlled by a logical operation selection logic signal PASS*. The logical operation selection logic 713-5 also comprises four logic selection transistors: logic selection transistor 762 coupled between the gates of the swap transistors 742 and a TF signal control line, logic selection transistor 752 coupled between the gates of the pass gates 793-1 and 793-2 and a TT signal control line, logic selection transistor 754 coupled between the gates of the pass gates 793-1 and 793-2 and a FT signal control line, and logic selection transistor 764 coupled between the gates of the swap transistors 742 and a FF signal control line. Gates of logic selection transistors 762 and 752 are coupled to the true sense line (e.g., 705-1) through isolation transistor 750-1 (having a gate coupled to an ISO signal control line), and gates of logic selection transistors 764 and 754 are coupled to the complementary sense line (e.g., 705-2) through isolation transistor 750-2 (also having a gate coupled to an ISO signal control line).

Operation of logic selection transistors 752 and 754 are similar based on the state of the TT and FT selection signals and the data values on the respective complementary sense lines at the time the ISO signal is asserted. Logic selection transistors 762 and 764 also operate in a similar manner to control the swap transistors 742. That is, to OPEN (e.g., turn on) the swap transistors 742, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 742 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 7 are summarized in the logic table illustrated in FIG. 8.

Figure 8:
FIG. 8 is a logic table illustrating selectable logic operation results implemented by a sensing circuitry in accordance with a number of embodiments of the present disclosure.

FIG. 8 is a logic table illustrating selectable logic operation results implementable by the sensing circuitry shown in FIG. 7 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 706 and compute component 731. The four control signals, in conjunction with a particular data value present on the complementary sense lines, controls the pass gates 793-1 and 793-2 and swap transistors 742, which in turn affects the data value in the compute component 731 and/or sense amplifier 906 before/after firing. The capability to selectably control the swap transistors 742 facilitates implementing logical operations involving inverse data values (e.g., inverse operands and/or inverse result), among others.

The logic table illustrated in FIG. 8 shows the starting data value stored in the compute component 731 shown in column A at 844, and the starting data value stored in the sense amplifier 706 shown in column B at 845. The other 3 top column headings (NOT OPEN, OPEN TRUE, and OPEN INVERT) in the logic table of FIG. 8 refer to the state of the pass gates 793-1 and 793-2, and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "Not Open" column 856 corresponds to the pass gates 793-1 and 793-2 and the swap transistors 742 both being in a non-conducting condition, the "Open True" 870 corresponds to the pass gates 793-1 and 793-2 being in a conducting condition, and the "Open Invert" 871 corresponds to the swap transistors 742 being in a conducting condition. The configuration corresponding to the pass gates 793-1 and 793-2 and the swap transistors 742 both being in a conducting condition is not reflected in the logic table of FIG. 8 since this results in the sense lines being shorted together.

Via selective control of the pass gates 793-1 and 793-2 and the swap transistors 742, each of the three columns of the first set of two rows of the upper portion of the logic table of FIG. 8 can be combined with each of the three columns of the second set of two rows below the first set to provide 3×3=9 different result combinations, corresponding to nine different logical operations, as indicated by the various connecting paths shown at 875. The nine different selectable logical operations that can be implemented by the sensing circuitry 750 are summarized in the logic table illustrated in FIG. 8.

The columns of the lower portion of the logic table illustrated in FIG. 8 show a heading 880 that includes the state of logic selection control signals. For example, the state of a first logic selection control signal is provided in row 876, the state of a second logic selection control signal is provided in row 877, the state of a third logic selection control signal is provided in row 878, and the state of a fourth logic selection control signal is provided in row 879. The particular logical operation corresponding to the results is summarized in row 847.

As such, the sensing circuitry shown in FIG. 7 can be used to perform various logical operations as shown in FIG. 8. For example, the sensing circuitry 750 can be operated to perform various logical operations (e.g., AND and OR logical operations) in association with performing a multiplication operation in memory in accordance with a number of embodiments of the present disclosure.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. A potential advantage of certain example apparatuses and methods described herein can be the cumulative speed that can be achieved by an entire bank of data being computed in parallel without necessarily transferring data out of the memory array (e.g., DRAM) or firing a column decode. For example, data transfer time can be reduced and/or eliminated. In addition, apparatuses of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred there between. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

What is claimed is:

1. A system, comprising:
    a processing resource; and
    a memory device coupled to the processing resource, wherein the memory device comprises:
        an array of memory cells; and
        sensing circuitry coupled to the array;
    wherein the memory device is configured to multiply, in parallel, a plurality of element pairs stored in the array by controlling the sensing circuitry to perform logical operation processing on data without moving the data out of the sensing circuitry via activation of column decode lines coupled thereto.

2. The system of claim 1, wherein the array comprises:
    a first group of cells coupled to a plurality of sense lines and to a first access line, wherein the first group of cells are configured to store a plurality of first elements of the plurality of element pairs; and a second group of cells coupled to the plurality of sense lines and to a second access line, wherein the second group of cells are configured to store a plurality of second elements of the plurality of element pairs, wherein sensing circuitry is coupled to the plurality of sense lines.

3. The system of claim 1, wherein the logical operation processing includes performing a number of AND logical operations on data without moving the data out of the sensing circuitry via activation of column decode lines coupled thereto.

4. The system of claim 1, wherein the memory device comprises control circuitry configured to provide control signals to the array and sensing circuitry to perform the logical operation processing.

5. The system of claim 1, wherein the memory device is configured to multiply, in parallel, the plurality of element pairs stored in the array responsive to an instruction received from the processing resource via a bus.

6. The system of claim 1, wherein the processing resource comprises a host processor.

7. The system of claim 1, wherein the array comprises a DRAM array.

8. The system of claim 1, wherein the array comprises a plurality of columns, and wherein the sensing circuitry comprises a plurality of sense amplifier and compute component pairs coupled to the array on a per column basis.

9. The system of claim 1, wherein at least two of the plurality of element pairs comprise different element bit-lengths.

10. The system of claim 1, wherein the memory device comprises control circuitry configured to:
receive instructions from the processing resource; and
provide control signals to the array and to the sensing circuitry to perform the logical operation processing.

11. A method, comprising:
receiving, to a memory device, an instruction to perform a plurality of multiplication operations on a respective plurality of element pairs stored in an array of the memory device; and
executing the instruction on the memory device, wherein executing the instruction comprises controlling sensing circuitry of the memory device which is coupled to the array of the memory device to multiply the plurality of element pairs and obtain respective results by performing a number of logical operations without transferring data from the sensing circuitry via activation of column decode lines coupled thereto.

12. The method of claim 11, wherein the method includes performing the plurality of multiplication operations in parallel, and wherein each of the plurality of element pairs comprises:
one of a respective plurality of first elements stored in memory cells coupled to a first access line of the array; and
a corresponding one of a respective plurality of second elements stored in memory cells coupled to a second access line of the array; and
wherein the memory cells storing respective corresponding element pairs of the plurality of element pairs are coupled to same sense lines.

13. The method of claim 11, wherein the method includes:
receiving the instruction to perform the plurality of multiplication operations from a processing resource external to the memory device via a bus; and
providing the respective results to the processing resource from the memory device.

14. The method of claim 11, wherein performing the plurality of multiplication operations on the respective plurality of element pairs comprises copying the respective results from the sensing circuitry to the array without transferring data from the sensing circuitry via activation of column decode lines coupled thereto.

15. The method of claim 11, wherein multiplying the plurality of element pairs and obtaining respective results includes performing a plurality of iterations of operations using a dynamic mask bit-vector and a static mask bit-vector.

16. The method of claim 15, wherein the method includes:
storing a plurality of first elements as a first bit-vector; and
storing a plurality of second elements as a second bit-vector; and
wherein the dynamic mask indicates at least one of:
a least significant bit of at least one of the first bit-vector and the second bit-vector; and
a most significant bit of at least one of the first bit-vector and the second bit-vector.

17. The method of claim 16, wherein the method includes storing the respective results as a bit-vector in memory cells coupled to a third access line of the array, and wherein the first access line, the second access line, and the third access line are different access lines.

18. A system, comprising:
a host; and
a memory device coupled to the host, wherein the memory device comprises:
sensing circuitry coupled to an array of memory cells, the array configured to:
store, in a first group of memory cells coupled to a first access line, a first bit-vector comprising a plurality of first elements of a respective plurality of element pairs; and
store, in a second group of memory cells coupled to a second access line, a second bit-vector comprising a plurality of second elements of the respective plurality of element pairs; and
a controller configured to control the sensing circuitry to:
perform logical operation processing to multiply, in parallel, respective corresponding element pairs of the plurality of element pairs by each other; and
store a results bit-vector in the array; and
wherein the memory device is configured to perform the multiplication and to store the results bit-vector in the array without data being transferred from the sensing circuitry to an external processing resource via activation of column decode lines coupled to the sensing circuitry.

19. The system of claim 18, wherein at least two of the plurality of first elements have different bit-lengths.

20. The system of claim 18, wherein the host comprises the external processing resource.

* * * * *